(12) United States Patent
Wagner

(10) Patent No.: US 8,631,383 B2
(45) Date of Patent: Jan. 14, 2014

(54) INTEGRATED CIRCUITS, STANDARD CELLS, AND METHODS FOR GENERATING A LAYOUT OF AN INTEGRATED CIRCUIT

(75) Inventor: Michael Wagner, Oberschweinbach (DE)

(73) Assignee: Qimonda AG, Munich (DE)

( * ) Notice: Subject to any disclaimer, the term of this patent is extended or adjusted under 35 U.S.C. 154(b) by 1249 days.

(21) Appl. No.: 12/165,132

(22) Filed: Jun. 30, 2008

(65) Prior Publication Data

US 2009/0321791 A1 Dec. 31, 2009

(51) Int. Cl.
*G06F 17/50* (2006.01)

(52) U.S. Cl.
USPC .......................................... 716/138

(58) Field of Classification Search
USPC .......................................... 716/138
See application file for complete search history.

(56) References Cited

U.S. PATENT DOCUMENTS

| | | | |
|---|---|---|---|
| 6,925,627 B1* | 8/2005 | Longway et al. | 257/207 |
| RE39,469 E * | 1/2007 | Fudanuki et al. | 326/39 |
| 2001/0011734 A1* | 8/2001 | Kanamoto et al. | 257/202 |
| 2002/0007478 A1* | 1/2002 | Tien | 716/2 |
| 2006/0181309 A1* | 8/2006 | Nakanishi | 326/44 |
| 2006/0243955 A1* | 11/2006 | Fujimoto | 257/1 |
| 2007/0096154 A1* | 5/2007 | Shimbo et al. | 257/207 |
| 2008/0174359 A1* | 7/2008 | Osada et al. | 327/534 |
| 2008/0315309 A1* | 12/2008 | Chang et al. | 257/346 |
| 2009/0093121 A1* | 4/2009 | Moon | 438/696 |
| 2009/0169832 A1* | 7/2009 | Aton | 428/195.1 |
| 2009/0267124 A1* | 10/2009 | Bosshard | 257/296 |
| 2010/0140665 A1* | 6/2010 | Singbal et al. | 257/204 |

* cited by examiner

*Primary Examiner* — Suresh Memula
(74) *Attorney, Agent, or Firm* — Cozen O'Connor

(57) ABSTRACT

An integrated circuit according to an embodiment of the invention includes a substrate having a first cell and a second cell, the first and the second cells being adapted to perform a substantially same functionality. Corresponding functional structures of the first and the second cell are electrically connected, at different locations inside the standard cells, to information carrying signal interconnection lines, wherein the functional structures are adapted to serve as an information carrying signal input or as an information carrying signal output.

11 Claims, 22 Drawing Sheets

INTEGRATED CIRCUITS, STANDARD CELLS, AND METHODS FOR GENERATING A LAYOUT OF AN INTEGRATED CIRCUIT

BACKGROUND

Integrated circuits are used today in a variety of different applications. Integrated circuits, are for instance, employed as individual electrical elements such as transistors for switching, amplifying or manipulating high frequency signals or high power signals, as sensors for detecting physical, chemical or biological influences of different sorts, and further individual electrical elements. More complex integrated circuits are also used, for instance, in the field of integrated sensors, which comprise, apart from the actual sensing elements, circuits to preprocess or to completely evaluate the acquired data from the sensing elements.

Integrated circuits are also used in the field of more advanced computer technology, for instance, as processors, memories, application specific integrated circuits (ASIC) up to whole SOC products (SOC=System on Chip) which represent a whole computer system including a processor, memory, and further peripheral circuits on a single chip. Integrated circuits are furthermore employed in graphic-related, security-related, and numerical-related applications.

The design and layout of integrated circuits is, in many cases, based on a standard cell design, in which standard cells are arranged and routed to allow a fast and flexible realization of different products and integrated circuits. In this design process, a number of partially contradicting measures and goals have to be balanced according to the application in mind. Some of the partially contradicting goals are, for example, area efficiency, costs, the complexity of the manufacturing process itself, the quality of the resulting integrated circuit, as well as other design goals, such as electrical, mechanical, or other parameters.

In many cases, an optimization of the design with respect to one parameter leads to another parameter being changed to the contrary. Hence, the design process of integrated circuits in general may sometimes profit from a greater flexibility, compared to the result of a design and manufacturing process with a more limited flexibility.

SUMMARY OF THE INVENTION

Embodiments according to the invention provide an integrated circuit with a substrate having a first cell and a second cell. The first and the second cells are adapted to perform a substantially same functionality, where corresponding functional structures of the first and the second cell are electrically connected, at different locations inside the standard cells, to information carrying signal interconnection lines. The functional structures are adapted to serve as an information carrying signal input or as an information carrying signal output.

An embodiment according to the invention further provides a standard cell of an integrated circuit, or of a design library, which comprise a first and a second power supply rail portion, where the first and the second power supply rail portions and a first and a second borderline of the standard cell enclose an enclosed area of an overall area of the standard cell. The standard cell further comprises a conductive structure, which is adapted to carry an information carrying standard cell input signal or an information carrying standard cell output signal of the standard cell. The conductive structure is at least partially arranged outside the enclosed area such that the conductive structure is connectable outside the enclosed area to an information carrying signal interconnection line.

An embodiment according to the invention provides a method for generating a layout of an integrated circuit based on a standard cell design, where at least some of the standard cells lack a predetermined contact for at least one information carrying standard cell input signal or for at least one information carrying standard cell output signal. The method comprises placing a plurality of standard cells in a standard cell area and routing information carrying signal lines for standard cell input signals or standard cell output signals. Routing comprises placing a contact for one of the one or more standard cell input signals or one of the one or more standard cell output signals of one of the placed standard cells.

An embodiment according to the invention also provides a method for generating a layout of an integrated circuit based on a standard cell design, where at least some of the standard cells lack predetermined contacts for a well or a substrate. The method comprises placing a plurality of standard cells in a standard cell area, routing information carrying signals for at least one standard cell input signal or for at least one standard cell output signal between two of the placed standard cells or between one of the placed standard cells and a non-standard cell circuitry, to obtain routed signal interconnection lines, and placing, inside the standard cell area, a contact for the well or the substrate, taking into account the locations of structural elements of the placed standard cells and the routed signal interconnection lines.

BRIEF DESCRIPTION OF THE DRAWINGS

Embodiments according to the invention will be described hereinafter, making reference to the appended figures.

FIG. 5b shows a cross-section through an integrated circuit according to an embodiment of the invention based on the standard cell shown in FIG. 5a;

FIG. 5c shows a circuitry diagram of the standard cell shown in FIG. 5a;

FIG. 7b shows a cross-section through the standard cell shown in FIG. 7a;

FIG. 7c shows a circuit diagram of the standard cell shown in FIG. 7a;

DETAILED DESCRIPTION OF ILLUSTRATIVE EMBODIMENTS

Figure 1:
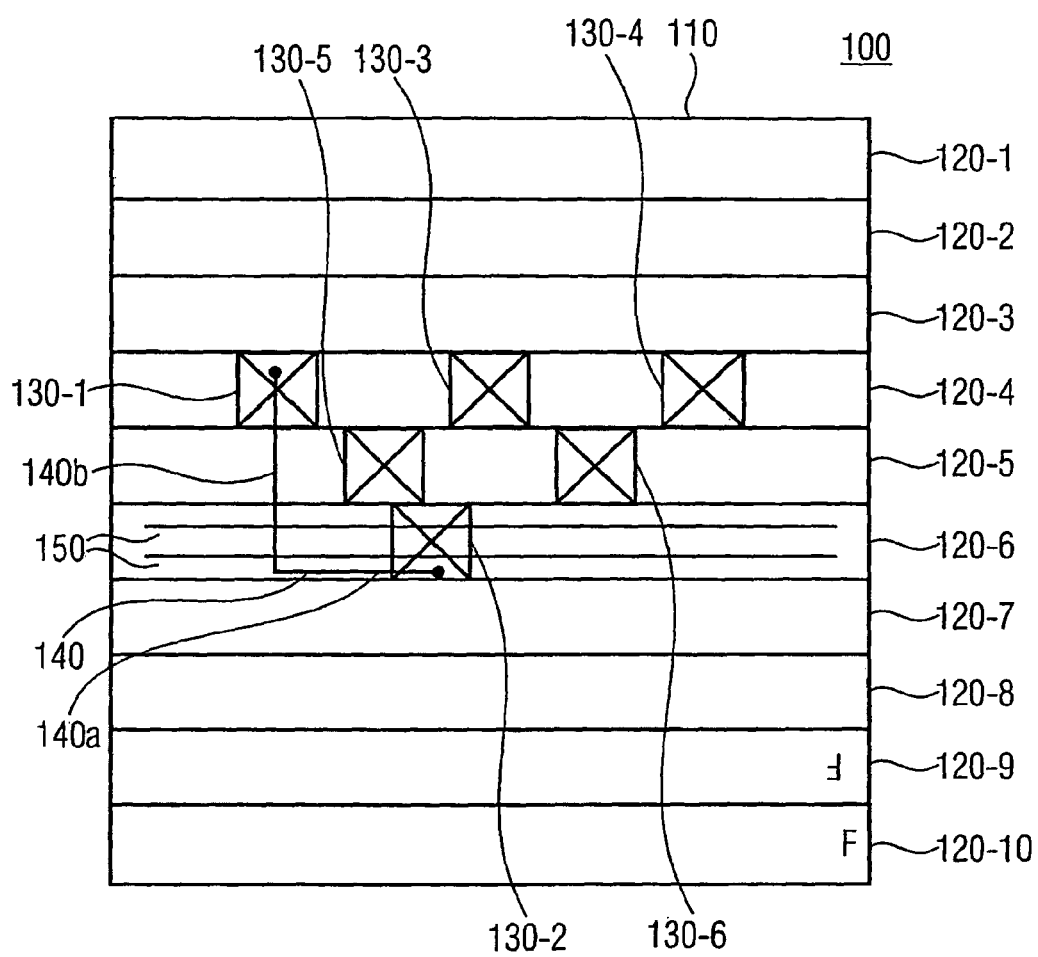
FIG. 1 shows a schematic block diagram of an integrated circuit according to an embodiment of the invention.

Integrated circuits are nowadays widely used in a variety of different applications. Integrated circuits are not only used as individual electrical elements such as transistors for high frequency or high power applications, as well as other electrical elements, also sensors are implemented as integrated circuits. Depending on the concrete implementation, the sensor implemented as an integrated circuit may, for instance, comprise only the actual sensing elements along with the necessary periphery circuits, or it may further comprise additional components, such as memory elements, logical and arithmetical units, and output circuits, to allow a pre-processing of the acquired measurement data. Other examples for integrated circuits come from the field of memory devices, processors (e.g., central processing unit (CPU) or graphical processing units (GPU)), applications specific integrated circuits (ASIC) such as crypto processors and other integrated circuits. Integrated circuits are even used as SOC systems (SOC=System-on-Chip), which include, apart from necessary periphery circuits for providing data to the SOC system, and for obtaining data from the SOC system, a processor and a memory circuit.

For a few years now, not only in the field of ASIC (application specific integrated circuits), but also in the field of DRAM devices (DRAM=Dynamic Random Access Memory), flash memories and other fields of integrated circuits, a P&R (place and route) process flow based on a standard cell design is used to rapidly realize and implement products. A typical "P&R" process flow includes placing of standard cells and routing of signal lines according to routing information which specify functionally which terminal of a standard cell is supposed to be connected to a terminal of another standard cell, or to non-standard cell circuitry.

In the earlier stages of the design process, the standard cells were considered to be logical units or gates, being adapted to fulfill a logical function. Standard cells, however, can also be adapted to implement functions based on logical functions. An example of such a logical standard cell is a latch, which can, for instance, be implemented as two feedback invertors. Further examples of standard cells will be described and outlined in more detail below.

It should be noted that integrated circuits according to embodiments of the invention are based on using a plurality of cells having a substantially identical functionality. Such cells are sometimes also referred to as standard cells. For the sake of simplicity, the cells will be referred to as standard cells.

In the following, integrated circuits, as well as layouts of integrated circuits, according to embodiments of the invention, will be described and explained in more detail. Naturally, the actual integrated circuit and the layout of the integrated circuit bare a strong resemblance with respect to each other, since the layout in fact represents a plan on how to fabricate the integrated circuit. Apart from process variations, ideally the concrete implementation of an integrated circuit according to an embodiment of the invention should be identical in terms of the basic layout structure, both typically comprising a plurality of identical standard cells placed at different positions.

Compared to a standard cell from a design library, a standard cell of a layout or of an integrated circuit may appear more than once. It may be implemented in more instances, for instance, twice, more than two-times or more than 10-times in a layout of the integrated circuit and the integrated circuit itself. Depending on the functionality implemented and the complexity of the integrated circuit, the standard cell may also appear more than 100-times or more than 1000-times. Also higher numbers may be used for a single standard cell. Naturally, a fabricated device may differ from the ideal layout due to the previously mentioned process fluctuations which may occur during the manufacturing process, such as displacements and rotations of different structures of the integrated circuit with respect to each other.

Although embodiments according to the present invention comprise a standard cell of a design library, that of a layout and that of a (fabricated) integrated circuit, the corresponding structures of the standard cells bear a special resemblance. Since the layout of an integrated circuit may be based on a standard cell of a design library, also the layout comprises to some extent similarities with the respective standard cells of the design library.

Since a fabricated integrated circuit is based on a layout, also the integrated circuit is based on the standard cell of the design library. Nevertheless, although a standard cell of an integrated circuit and the integrated circuit differ in terms of their physical appearances from a standard cell of a design library, a standard cell of a layout and the layout itself, the similarities and, to some extent, the equivalence of these allow descriptions to be transferred to one another. Hence, by describing a layout, also the corresponding layout of an integrated circuit itself is described. It should be noted that similar equivalents or resemblances exist between standard cells of the design library, which mainly represent patterns used in the framework of generating the layout, and a standard cell as represented in the integrated circuit. The equivalents or resemblance between the standard cells of the design library and that of the integrated circuit will later be described in more detail.

FIG. 1 shows a layout of an integrated circuit 100 according to an embodiment of the invention. The integrated circuit 100 comprises a so-called core area or standard cell area 110 which is arranged in rows 120-1, . . . , 120-10, in which standard cells can be placed during the placement in the framework of the P&R process according to another embodiment of the invention. In other words, the core area 110 is the area in which standard cells may be arranged or placed.

FIG. 1 shows an overall of six standard cells 130-1, . . . , 130-6, which are shown in FIG. 1 as rectangular boxes with a tilted cross. The standard cells 130 may be, for instance, identical standard cells, or the respective standard cells may differ from one another at least partly.

Optionally, the standard cells 130 may be rotated, mirrored, or flipped. If, for instance, the standard cell 130 comprises an asymmetric internal structure itself, by flipping or mirroring standard cells in adjacent rows 120, these may be symmetrically arranged. As a consequence, it may be possible to employ the resulting symmetry, even in the case of asymmetric standard cells 130, to limit a length of the connecting signal lines. This optional flipping is schematically indicated in FIG. 1 in rows 120-9 and 120-10 by the two markers "F" of which the marker in row 120-9 is flipped with respect to a horizontal direction of FIG. 1. However, although the rows 120-9 and 120-10 shown in FIG. 1 are flipped, this is by far not mandatory.

The standard cells 130-1 and 130-2, as an example, are coupled to one another by a signal line 140, which is a signal line for an information carrying signal, and which may be transported from standard cell 130-1 to standard cell 130-2, in the opposite direction, or in both directions, depending on the contact or terminals involved of the respective standard cells 130-1, 130-2.

The signal line 140 is a signal line for an information carrying signal which couples a standard cell input and a standard cell output. The standard cell 130 which is coupled to the signal line 140 is, therefore, capable of performing the logic function for which the respective standard cell is intended based on the information provided by the signal line 140.

The logic function may for instance be that of an OR gate, that of an AND gate, that of a NAND gate, that of a NOR gate, that of an inverter or any other logical function based on one of the previously mentioned, including for instance, adding one or more signals digitally, or storing a signal in a latch-configuration of logical gates.

Figure 2:
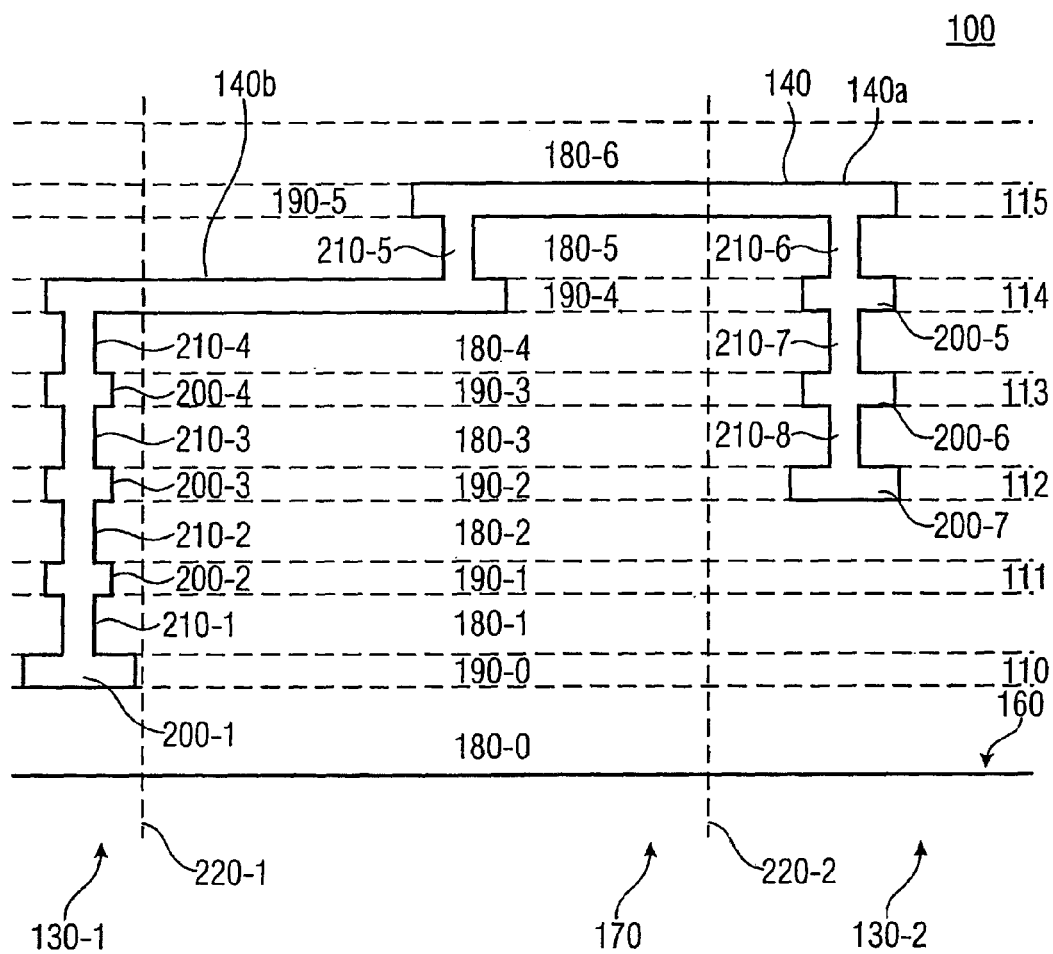
FIG. 2 shows a cross-section through the integrated circuit of FIG. 1.

The signal line 140 comprises a first part 140a extending horizontally in FIG. 1 and a second portion 140b extending vertically. The two standard cells 130-1, 130-2 are coupled to each other by means of two upper metal layers in the case of the integrated circuit according to the embodiment shown in FIG. 1. The metal layer comprising the portion 140b is here metal layer M4, whereas the portion 140a is comprised in metal layer M5. To further illustrate this, a cross-section through the ASIC of FIG. 1 along the extension of the signal line 140 is shown in FIG. 2. However, before describing the cross-section in FIG. 2, it should be noted that further signal lines may be comprised in the IC 100. Two examples are shown in the form of segments of signal lines 150. Furthermore, the number of standard cells 130, as well as the number of rows 120, the geometrical arrangement, and further design-specific or layout specific parameters and options may vary from integrated circuit to integrated circuit.

FIG. 2 shows a cross-section through the integrated circuit 100 along the signal line 140 connecting the first standard cell 130-1 and the second standard cell 130-2. The cross-section of FIG. 2 shows a sequence of layers on top of a surface 160 of a substrate 170 of the integrated circuit 100. The substrate 170 may comprise additional structures, for instance, wells, trenches and other structures, which for the sake of simplicity, are omitted from FIG. 2. The substrate 170 may for instance be a silicon substrate (Si), a gallium arsenide substrate (GaAs), or any other substrate suitable for the application in mind. For instance, the substrate 170 may be a SOI substrate (SOI=Silicon-on-Insulator), or an insulating substrate such as sapphire or quartz.

On top of the surface 160 of the substrate 170, a first insulating layer 180-0 is deposited. On top of the insulating layer 180-0, a first metal layer 190-0 is arranged, which is also referred to as metal layer M0. On top of metal layer 190-0 a similar stack of insulating layers 180-1, . . . , 180-5 with corresponding metal layers 190-1, . . . , 190-5 are stacked on each other. The metal layers 190-1, . . . , 190-5 are also accordingly referred to as metal layers M1, . . . , M5. On top of metal layer 190-5, a further insulating layer 180-6 is deposited to electrically insulate metal layer 190-5 from circuits or structures above or external influences.

Naturally, the individual metal layers 190 are not required to cover the whole surface of the integrated circuit 100. The individual metal layers 190 represent structured metal layers which comprise metallic structures which are used, for instance, for signal lines and other electrical connections. Typically, a ratio of metal structures which are present in a specific metal layer, with respect to the overall area of the integrated circuit 100, lies in the range between 20% and 80%.

The metal layers 190 may be fabricated from metals or alloys. The individual metal layers 190-0, . . . , 190-5, may differ with respect to the material composition. The metal layers 190 may, for example, comprise aluminum (Al), copper (Cu), Tungsten (W), Gold (Au), Silver (Ag), as well as other metals and alloys of at least one metal.

The insulating layers 180 may for instance be oxide layers, nitride layers, insulating organic layers (e.g., polyamide, polyimide), other insulating layers or comprise more than just one layer of any of the previously mentioned. Naturally, the individual insulating areas 180-0, . . . , 180-6 may differ with respect to composition, thickness, and further parameters.

As briefly mentioned in the context of FIG. 1, the signal line 140 connecting the two standard cells 130-1, 130-2 is comprised in the upper metal layers 190-4 (M4) and 190-5 (M5). In the embodiments described herein, the four metal layers below are assumed to be exclusively used for the circuitry inside the respective standard cells 130, which is just one possible implementation.

In the cross-section shown in FIG. 2, a conductive structure 200-1 arranged in metal layer 190-0 (M0) is connected to a corresponding conductive structure 200-2 of metal layer 190-1 by a via 210-1. The via 210 is an essentially vertically extending conductive structure which is arranged inside a recess of the insulating layer 180-1, and filled with the metal, alloy, or other electrically conducting material. Apart from the previously mentioned metals and alloys, poly-silicon (poly-Si) may also be used, which may additionally be doped to increase the electrical conductivity.

The conductive structure 200-2 is connected by a further via 210-2 to a conductive structure 200-3 in a metal layer 190-2 (M2), which in turn may be coupled to vias 210-3 and 210-4 and a conductive structure 210-4 to the portion of the signal line 140b arranged in metal layer 190-4 (M4).

Portion 140b of the signal line 140 is, in the cross-section shown in FIG. 2, the first structure which leaves the standard cell 130-1 by crossing a borderline 220-1 of the standard cell. As previously mentioned, portion 140b of the signal line 140 is part of the metal layer 190-4 (M4) extending into the area between the two standard cells 130-1, 130-2. For the sake of simplicity, representations of further structural elements between the two standard cells 130-1 and 130-2 have been omitted here. Respective structures may naturally be arranged, for instance, further standard cells.

Approximately in the middle of the cross-section shown in FIG. 2, the portion 140b is connected to the portion 140a, arranged in metal layer 190-5 (5), by a via 210-5 enabling an electrical contact bridging the insulating layer 180-5. To be able to arrange as many signal lines for information carrying signals, as well as supply signals (e.g., a supply voltage or a supply current), a preferred direction for the signal lines in each of the metal layers 190 exists. In the case of the embodiment shown in FIGS. 1 and 2, metal layer 190-4 (M4) corresponds to signal lines with a vertical direction, whereas metal layer 190-5 (M5) corresponds to signal lines extending in the horizontal direction as shown in FIG. 1. As a consequence, the location of via 210-5 interconnecting the two portions 140a, 140b of the signal line 140 in FIG. 2 represents the location of the "kink" of the signal line 140 in FIG. 1.

The portion 140a of the signal line 140 then crosses the borderline 220-2 of the second standard cell 130-2. Inside standard cell 130-2, the signal line 140 is coupled to a conductive structure 200-5 of the metal layer 190-4 by a via 210 inside of the insulating layer 180-5. The conductive structure 205 is then coupled by two vias 210-7, 210-8 and a conductive structure 200-6 of the metal layer 190-3 (M3) to the intended contact of standard cell 130-2 in the form of a conductive structure 200-7 in metal layer 190-2 (M2).

In terms of the previously described similarity between standard cells of a design library and of an integrated circuit, the individuals vias 210 and optionally the interconnecting metallic or conductive structures 200 (e.g., conductive structure 200-6) may be referred to as a contact in terms of generating a layout according to an embodiment of the invention. Further examples will, however, be given below.

As mentioned earlier, the integrated circuit according to an embodiment of the invention is described in context with FIGS. 1 and 2, is an ASIC chip, for which typically four layers of metal are available for placing and routing of signal lines. However, especially in the field of commodity devices such as memory devices (e.g., DRAM devices or flash memory devices), very often the number of available metal layers is smaller. As a consequence, special challenges of the design of a standard cell, as well as the further process flow appears. Moreover, in the field of integrated circuits which are produced in high numbers, an optimized design with respect to the occupied area may be important. For electrical reasons, it may furthermore be favorable to introduce a maximal number of substrate contacts and well contacts to make the design more robust in terms of fluctuations of potentials inside the integrated circuit and to increase the performance.

At the same time, considering the above indicated boundary conditions, implementing a small and fast design with a high performance may for instance be a challenge, when the number of available metal layers for placing and routing is limited. To illustrate the applicability of integrated circuits, standard cells, and methods for generating a layout according to embodiments of the invention, same will be described which do not require more than four metallization layers. Many of the embodiments described in the following can even be implemented with less metal layers.

However, it should be noted that the embodiments of the invention are by far not limited to integrated circuits and standard cells with four or less metallization layers.

Figure 3:
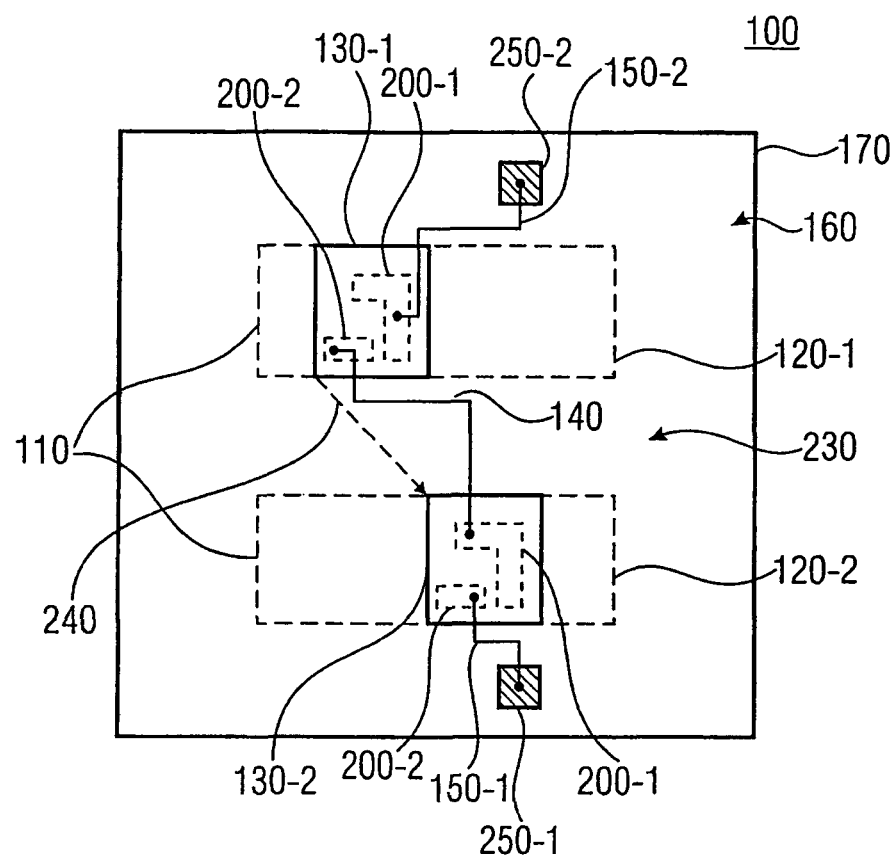
FIG. 3 shows an integrated circuit according to an embodiment of the invention.

FIG. 3 shows an integrated circuit 100 according to an embodiment of the invention with a substrate 170. The surface 160 of the substrate 170 represents the so-called die area of which the core area 110 is a subset in the mathematical sense. In the case of an integrated circuit 100 shown in FIG. 3, the core area 110 comprises two rows 120-1, 120-2. As a consequence, in contrast to the integrated circuit 100 shown in FIG. 1, the die area of the substrate 170 is not identical to that of the core area, since between the two rows 120-1, 120-2, a gap 230 is present.

The integrated circuit 100 shown in FIG. 3 comprises a plurality of standard cells 130-1, 130-2 which are adapted to fulfill an identical functionality. FIG. 3 shows a first standard cell 130-1 of the plurality of standard cells in the first row 120-1, and a second standard cell 130-2 of the plurality of cells in the second row 120-2, which are interconnected by a signal line for an information carrying signal 140.

The two standard cells 130-1, 130-2, which are also referred to as the cells 130-1, 130-2, are identical standard cells, each comprising an L-shaped conductive structure 200-1 and a smaller rectangular-shaped conductive structure 200-2. In the case of the integrated cell 100, according to an embodiment of the invention as shown in FIG. 3, the two standard cells 130-1, 130-2 are not only identical in terms of their functionality, but also identical in terms of their structure, as it is often the case when similar electrical parameters are involved (e.g., same resistances).

The first standard cell 130-1 and the second standard cell 130-2 are, in the case shown in FIG. 3, mere displaced versions of each other, as indicated by a dashed arrow 240 in FIG. 3. However, as previously mentioned, the two identical standard cells 130 may also be rotated, flipped, or mirrored with respect to each other.

The conducting structure 200-1 of each of the standard cells 130 is in this case a structure carrying a standard cell output signal, whereas the conductive structure 200-2 is a structure carrying a standard cell input signal of the respective standard cells. The signal line 140 interconnects the first conductive structure 200-1 of the second standard cell 130-2 with a second connective structure 200-2 of the first standard cell 130-1, to provide the first standard cell 130-1 with the standard cell output signal of the second standard cell 130-2 as the standard cell input signal. The signal line 140 is, hence, also referred to as an information carrying signal line or an information carrying interconnection signal line. The signal line 140 may be, hence, thought of to interconnect the respective (standard) cells with each other, with other (standard) cells, or with non-standard cell circuitry in embodiments according to the invention, the signal lines leave the standard cell. This may hold also true for other information carrying signal lines.

Although in many cases the conductive or functional structures may not be implemented to serve this specific case, they may be thought of as input/output structures or interface structures, depending on implementational details. These structures may primarily serve a different function in the standard cells such that the standard cells do not comprise for at least one of a standard cell input or standard cell output a contact area. In other words, the standard cell may lack such a contact area.

The integrated circuit 100 of FIG. 3 furthermore comprises a first non-standard cell circuitry 250-1 and a second non-standard cell circuitry 250-2 as optional components to which the two standard cells 130-2 and 130-1 are coupled, respectively. The two non-standard cell circuitries 250-1, 250-2, may, for instance, be bond pads or other electrical elements, as well as more complex circuits, which are not based on the standard cell design.

Although in many embodiments according to the invention in the form of an integrated circuit 100, such non-standard cell circuitry may be included to allow an electrical connection of the integrated circuit 100, circuits like these are optional components, which are not necessarily required for the operation of the integrated circuit 100. An example is, for instance, an integrated circuit 100 in the form of a SOC system with the core area 110 for the standard cells 130 being limited to a smaller sub-circuitry of the SOC system.

In the case of the integrated circuit 100, as shown in FIG. 3, the two non-standard cell circuitries 250-1, 250-2 are bond pads to allow an electrical connection of the integrated circuit 100 with external components. The bond pad 250-1 is coupled to the second conductive structure 200-2 of the second standard cell 130-2 by a signal line 150-1 and the second bond pad 250-2 is coupled to the first conductive structure 200-1 of the first standard cell 130-1 by a signal line 150-2. Bond pad 250-1 is, therefore, an input of the integrated circuit 100 for an information carrying signal provided to the second standard cell 130-2, which will be processed by the series connection of the two standard cells 130-2, 130-1 interconnected by the signal line 140, and provided by the signal line 150-2 to the bond pad 250-2. In this case, the bond pad 250-2 represents an output of the integrated circuit 100.

The signal lines 140, 150 are in the case of the integrated circuit 100, according to an embodiment of the invention, connected to the conductive structures 200 of the two standard cells 130 at different locations inside the standard cells 130. While, for instance, signal line 150-1 is connected to the right side of the conductive structure 200-2 in the case of a standard cell 130-2, the corresponding connection of signal line 140 is made to the conductive structure 200-2 of the standard cell 130-1 at the right side of the respective structure. Similarly, signal line 140 is connected to an edge area of the L-shaped conductive structure 201 of the second standard cell 130-2, whereas the signal line 150-2 is connected to the corresponding first conductive structure 200-1 of the first standard cell 130-1 in a center part of a bar of the L-shaped structure 200-1.

In other words, the first and the second standard cell 130-1, 130-2 of the plurality of standard cells, are at different locations inside the standard cells, electrically connected to information carrying signal lines 140, 150, interconnecting the first and the second standard cell 130-1, 130-2 with each other, with other standard cells or with non-standard cell circuitry 150.

This illustrates that the flexibility which has been employed during the routing of the signal lines 140, 150 of the integrated circuitry 100 from which the integrated circuit 100 may benefit in terms of different parameters. It may be possible to generate smaller layers for an integrated circuitry 100 with a high performance or a reduced number of metal layers. Due to the flexibility, it may be possible to reduce the time for the layout, to enable a quicker generation of the layout. Naturally, depending on the integrated circuit 100 in mind, a combination of the previously mentioned effects may also be achievable by employing embodiments according to the invention. To illustrate the flexibility of an integrated circuit 100, as shown in FIG. 3 in more detail, in the following a standard cell 130, will be described in the context of FIG. 4.

Figure 4:
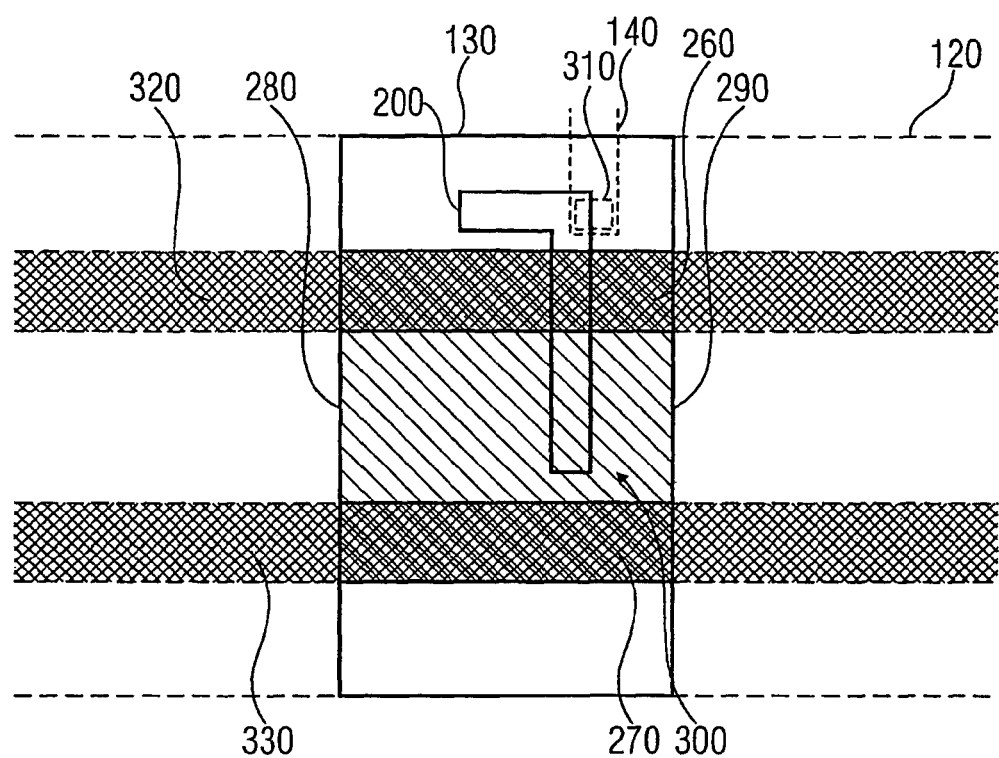
FIG. 4 shows a standard cell according to an embodiment of the invention.

FIG. 4 shows a standard cell 130, which may for instance be placed inside a row 120, in which apart from the standard cell 130 shown, further standard cells may be arranged. The standard cell 130 comprises a conductive structure 200 which is adapted to carry an information carrying standard cell input signal, or an information carrying standard cell output signal of the standard cell 130. In other words, conductive structure 200 may be part of an input or an output of the standard cell 130. The conductive structure 200 may, for instance, be a semiconducting structure, or a metallic structure, based on a metal or an alloy.

The standard cell 130 further comprises a first power supply rail portion 260 and a second power supply portion 270, which are intended for two different power supply terminals or power supply connections, e.g., two different power supply potentials. The two power supply rail portions 260, 270, extend with respect to each other, in parallel so that the two power supply portions 260, 270, enclose with a first borderline 280 and with a second borderline 290 of the standard cell 130, an enclosed area 300 which is shown diagonally shaded in FIG. 4. The conductive structure 200 is partially arranged outside the enclosed area 300, to allow an electrical contact with a signal line for an information carrying signal. The conductive structure 200 may, for instance, be part of or an extension of a transistor (e.g., a gate terminal of a field effect transistor) or another electrical element.

To illustrate this in more detail, a possible connection of a conductive structure 200 with a signal line 140 is shown in FIG. 4. The contact between the signal line 140 and the conductive structure 200 is made by placing a contact 310, which may, for instance, comprise in a real live implementation of the corresponding integrated circuit 100, according to an embodiment of the invention, a via as shown in the context of FIG. 2.

Standard cells 130 with a new design as, for instance depicted in FIG. 4, provide a greater flexibility in terms of placing contacts 310, since at least not all contacts have predefined locations inside the standard cells 130. By moving the structures of the standard cell responsible for the intended functionality into the middle of the cell, space is gained at the outside borders of the respective cells. Typical structures comprise, for instance, transistors such as bipolar transistors or field effect transistors, and other electrical elements. By moving, for instance, the transistors as close as possible to the middle of the standard cell, less metal of the lowest lying metal layer M0 will have to be used at the borders of the cell, so that at the outside of the cell the number of possible connection schemes to contact the standard cell will be increased. As an optionally present effect, the gate contacts between neighboring transistors may be reduced, increasing the performance of the standard cell.

The signal line 140 is a signal line for an information carrying signal. In contrast to an information carrying signal, a power supply signal, as well as the corresponding signal lines or power supply rails, are not intended to carry information. As a result, in typical applications, the potential of a power supply rail or a corresponding non-information carrying signal line is fixed or at least not varied to transport pieces of information. In other words, over these power supply rails or signal lines no pieces of information will be transported in the normal operation conditions in the form of fluctuations of the potential or voltage.

The first and second power supply rail portions 260, 270 will become part of the power supply rails in the case of the standard cell 130 being incorporated into a design, or a layout, for an integrated circuit 100. The power supply rail portions 260, 270 typically extend from one borderline 280 to the other borderline 290 of the standard cell 130, so that by placing identical or different standard cells 130 next to each other, the sequence of power supply rail portions 260, 270 form continuous power supply rails 320, 330.

This is illustrated in FIG. 4 as dashed continuations of the first and second power supply rail portions 260, 270 forming a first and a second power supply rail 320, 330, respectively. The area of the power supply rail portions 260, 270, of the first standard cell are usually comprised in the enclosed area 300. Moreover, in many embodiments according to the invention, the first and second borderlines 280, 290 extend essentially perpendicular with respect to the two power supply rail portions 260, 270.

The power supply rail portions 260, 270, as well as corresponding power supply rails 320, 330, are in many embodiments according to the invention implemented as broader metal lines comprising a single metal or an alloy. Less frequently, semiconducting power supply rails will be implemented since metals and alloys typically comprise a higher electrical conductivity. Moreover, in many embodiments according to the invention, the power supply rails 320, 330, as well as the corresponding power supply rail portions 260, 270 are wider than information carrying signal lines 140, 150, since more power and typically more current will be transported via the power supply rails 320, 330.

Since many standard cells 130 for logical functions are based on field effect transistors employing CMOS transistor technology (CMOS=Complementary Metal Oxide Semiconductor), each standard cell 130 typically comprises at least one PMOS-transistor and at least one NMOS-transistor, of which the respective gate terminals are interconnected. The interconnection between the two gate terminals of the two transistors may be shortened, leading to lesser values of the resistance and lesser values of the capacitance. In embodiments according to the invention, two transistors of a standard cell may, for instance, be separated by less than 3 times the minimal distance between two such transistors in the underlying technology. For example, based on a technology allowing a distance 150 nm for as a minimal distance between two transistors, the two previously mentioned transistors have a distance of less than 450 nm. Naturally, this may not only apply to transistors, but also to other structures.

As a consequence of these fundamental changes with respect to the design of the standard cells 130, it is possible to move the contacts of the standard cell to the outside of the standard cell. Conductive structures for information carrying standard cell input or output signals are, therefore, moved outside the enclosed area 300 which represents the previously described center area 300 of the standard cells, due to its position between the two power supply rail portions 260, 270 and the two borderlines 280, 290.

Accordingly, the number of potential conflicts between the positions of the two power supply rail portions, for instance, for the positive power supply (Vdd) and ground (Vss or Gnd,) and routed signal lines will be reduced. This offers the possibility of a more flexibly routing signal lines 140, 150 for information carrying signals also in the lower lying metal layers M0.

The power supply rails 320, 330 and the corresponding power supply rail portions 260, 270 may, as a result, be routed and comprised in the second metal layer M1 in the center of the standard cell, which also generates more flexibility in terms of routing signal lines in the metal layer M1. To summarize, the new standard cell design allows a simpler routing of the signal lines which may lead to a simpler routing of information carrying signals in general.

Furthermore, the new standard cell design and the described conceptional changes may also lead to smaller and more compact layouts, so that during placing and routing of the standard cells 130 and the corresponding signal lines 140, 150, smaller circuitry blocks may be generated. Compared to conventional standard cells, a reduction of the overall area of the standard cell by employing a new standard cell according to an embodiment of the invention of up to 18% may be realized, with respect to the standard cells 130 themselves. After placing and routing an additional reduction of the overall area of up to 20% may be achievable under some circumstances. In further tests, generated blocks of standard cells, including the signal lines, were also smaller and more easily implemented. Based on embodiments according to the invention, an overall reduction of the area of approximately 25% was achievable during these tests.

Naturally, the aforementioned reductions of area sizes may depend on a large variety of parameters. As a consequence, employing embodiments according to the invention, may yield reductions of varying sizes. Since the generation of a layout for an integrated circuit is always a tradeoff and a compromise between different design goals, employing embodiments according to the invention are by far not required to lead to an overall reduction of the area of the integrated circuit. In contrast, other design goals may be more important in specific applications, than an overall reduction of the size. An example may, for instance, be a reduction of the manufacturing costs, by implementing less metallization layers or an extension of the possible operational parameters. Such design goals may not eventually lead to a reduction of the chip area at all.

In the following description, further embodiments according to the invention will be described in more detail. To simplify the description of embodiments according to the invention below, and to allow for a clearer and more concise discussions of the features and properties of different embodiments according to the invention, in the following, similar or equal reference signs will be used for structures, objects and units with a similar or identical structure or functional properties. As an example, the standard cells will be denoted with the reference sign 130.

Moreover, summarizing reference signs will be used for objects, structures, and units appearing more than once in an embodiment according to the invention. Unless a specific structure, object, or unit is referred to, the summarizing reference sign will be used to describe and discuss properties and features of the respective structures, objects, and units. If, however, a specific structure, or unit is described, the corresponding individual reference sign will be used. In FIG. 3, for instance, the first standard cell was referred to as standard cell 130-1, while the second standard cell was referred to as standard cell 130-2. However, when discussing general properties or features of the standard cells, reference was made to the standard cells 130.

Figure 5A:
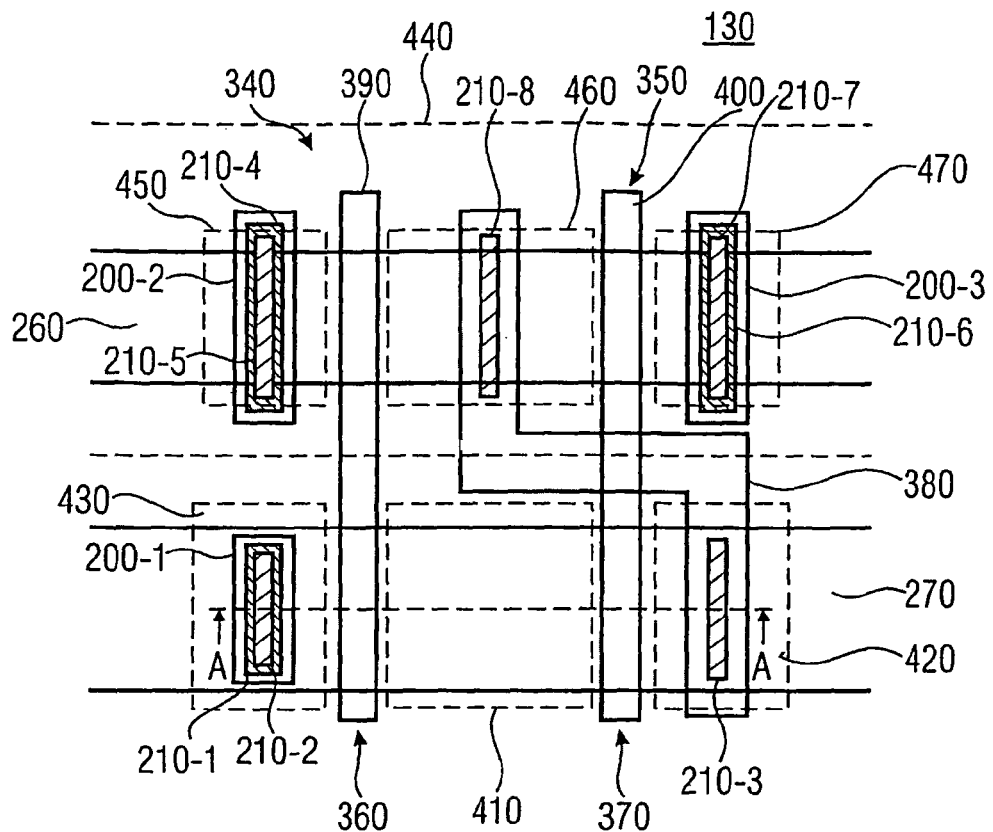
FIG. 5a shows a standard cell in the form of a NAND gate according to an embodiment of the invention.
Figure 5B:
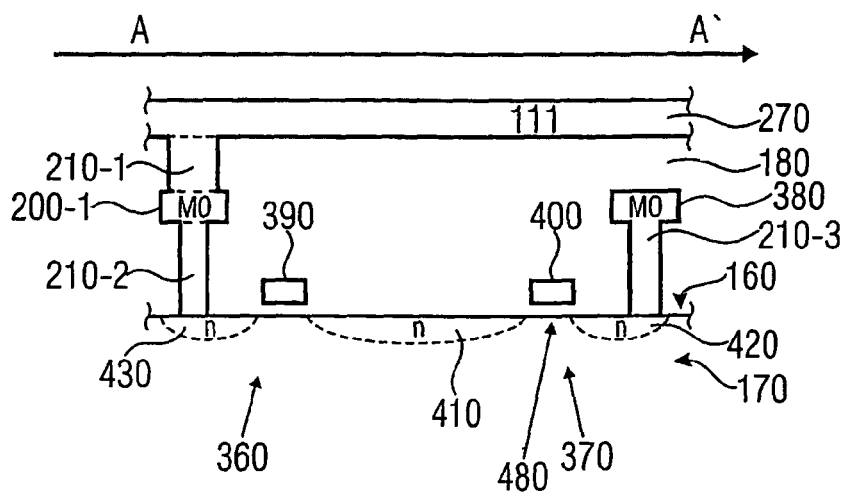
Figure 5C:
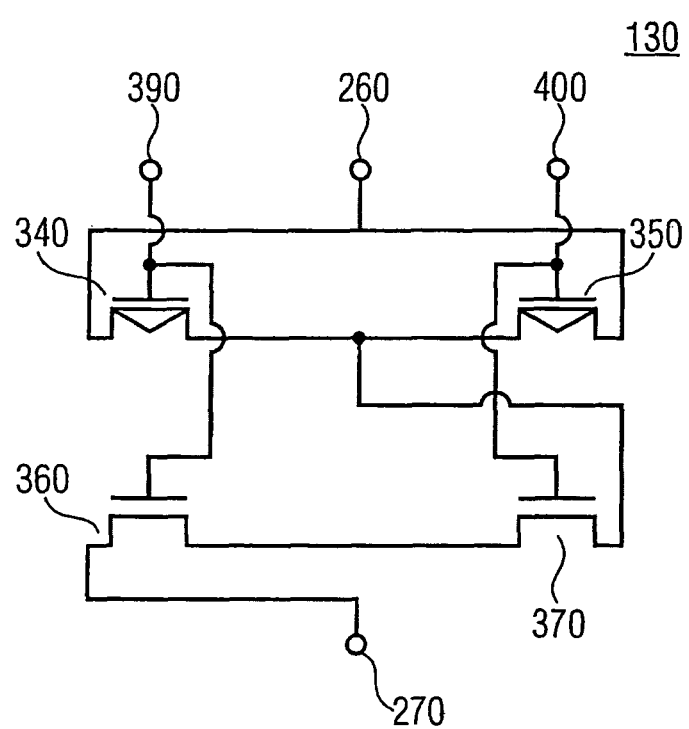

FIG. 5a shows a schematic top view of a standard cell 130 of a design library according to an embodiment of the invention in the form of a NAND gate. To simplify the description of the structure of the standard cell 130 shown in FIG. 5a, a cross-section along a dashed line A-A' through a concrete implementation according to an embodiment of the invention in the form of an integrated circuit is shown in FIG. 5b. Moreover, FIG. 5c illustrates the corresponding circuit diagram of a standard cell shown in FIG. 5a, taking into consideration the locations of the transistors of the NAND gate as shown in FIG. 5a.

The NAND gate of the standard cell 130 shown in FIG. 5a is based on CMOS-implementation based on a first PMOS-transistor 340, a second PMOS-transistor 350, a first NMOS-transistor 360, and a second NMOS-transistor 370. The cross-section of FIG. 5b, therefore, shows a cross-section through the NMOS-transistors 360, 370.

A source contact of the two PMOS-transistors 340, 350 is coupled to the first power supply rail portion 260, which is intended to be part of the power supply rail for the positive power supply potential (Vdd). The two PMOS-transistors 340, 350 are coupled by their respective drain terminals to the conductive structure 380, at which the output of the standard cell 130 is present during operation. In contrast to the first power supply rail portion 260, the conductive structure 380 is an information carrying structure.

Moreover, the drain terminals of the two PMOS-transistors 340, 350 are coupled to the drain terminal of the second NMOS-transistor 370. A source terminal of the second NMOS-transistor 370 is connected to a drain terminal of the first NMOS-transistor 360, the source terminal of which is coupled to the second power supply rail portion 270, which is part of the second power supply rail for the negative supply voltage (Vdd or Gnd).

A gate terminal of the first PMOS-transistor 340 and the gate terminal of the first NMOS-transistor 360 are coupled in parallel to conductive structure 390, which is also an input of the NAND gate. Similarly, a gate contact of the second PMOS-transistor 350 is coupled in parallel to a gate terminal of the second NMOS-transistor 370 by a conductive structure 400, which is a second input of the NAND gate.

Switching back to the top view of the standard cell 130 in FIG. 5a, the conductive structures 390, 400 are implemented as vertically extending poly-silicon structures (poly-Si), but which serve as the actual gate electrodes of the four transistors 340, . . . , 370. This is also illustrated by the cross-section through the two NMOS-transistors 360, 370 shown in FIG. 5b. In an actual implementation of the standard cell 130, the region below the two conductive structures 390, 400 (gate electrodes) is the region in which the channel of the respective field effect transistor is formed underneath the surface 160 of a substrate 170 of the integrated circuit.

The implementation shown in FIGS. 5a to 5c is based on a (optionally slightly) p-doped substrate 170. A common n-doped well 410 represents the source terminal of the second NMOS-transistor 370 and the drain terminal of the first NMOS-transistor 360 at the same time. A n-doped well 420 forms the drain terminal of the second NMOS-transistor 370 and an n-doped well 430 forms the source terminal of the first NMOS-transistor 360. The channels of the transistors are formed underneath the conductive structures 390, 400 between the wells. One example is shown as channel 480 between the wells 410, 420. All three wells 410, 420, 430 are shown in FIGS. 5a and 5b.

As described in the context of the circuitry diagram of FIG. 5c, the source terminal of the first NMOS-transistor 360 is coupled to the second power supply rail portion 270. This connection to the second power supply rail portion 270 is part of the standard cell shown in FIG. 5a. The first and second power supply rail portions 260, 270 are part of the second metallization layer M1, which is arranged over a first metallization layer M0 and electrically insulated from the surrounding structures by one or more insulating layers 180.

The second power supply rail portion 270 is coupled to a conductive structure 200-1, which is part of the metal layer M0 by contact in the form of a via 210-1. By a further contact in the form of a via 210-2, an electrical contact is established between the first conductive structure 200-1 and the n-doped well 430, generating a fixed potential at the source terminal of the first NMOS-transistor 360.

The conductive structure 380 connecting the drain terminals of the two PMOS-transistors 340, 350, with the drain terminal of the second NMOS-transistor 370, is also arranged in the first metallization layer M0. By a further contact in the form of a via 210-3, an electrical contact is established between the conductive structure 380 and the n-doped well 420, which is the drain terminal of the NMOS-transistor 370.

The first PMOS-transistor 340 and the second PMOS-transistor 350 are both p-channel field effect transistors, so that the respective transistors are integrated into an n-doped well 440, providing an n-doped region for the body areas of the two transistors underneath the two conductive structures 390, 400 acting as gate terminals. Inside the n-doped well 440, three additional wells 450, 460, and 470, are established, which are all p-doped. The p-doped well 450 is the source terminal of the first PMOS-transistor 340. Similarly, the p-doped well 470 is the source terminal of both PMOS-transistors 350. In between the two wells 450, 470, the p-doped well 460 represents the drain terminal of both transistors.

The contact of the source terminals of the first and second PMOS-transistors 340, 350 to the first power supply rail portion 260, is established in a similar fashion as the electrical contact of the source terminal of the first NMOS-transistor 360 to the second power supply rail portion 270 the first power supply rail portion 260, which is also part of the second metallization layer M1, is coupled by a contact in the form of a via 210-4 to a conductive structure 200-2, which is part of the metallization layer M0. A further contact in the form of a via 210-5 couples the conductive structure 200-2 to the source-terminal of the PMOS-transistor 340 in the form of the well 450.

A similar connection provides contact of the well 470, acting as the source terminal of the PMOS-transistor 350, to the first power supply rail portion 260. A contact in the form of a via 210-6, provides electrical contact to the conductive structure 200-3, which is part of the metallization layer M0. Further contacts in the form of a via 210-7 finally provides contact to the well 470. The drain terminals of the first and second PMOS-transistors 340, 350 in the form of the well 460 is electrically connected to the conductive structure 380 by a contact in the form of a via 210-8.

The conducting structure 380 forms the conducting structure carrying the standard cell output signal to which an electrical contact may be established by placing an appropriate contact during the placing and routing according to an embodiment of the invention. Similarly, the two conducting structures 390, 400 acting as the gate electrodes of the four transistors 340-370, are in the case of the NAND gate, the conductive structures carrying the corresponding standard cell input signals. Contacts may be placed during the placing of the routing of a standard cell 130 to any location of the respective structures 380, 390, 400, which is accessible for a metallization layer of the same, or higher, order. For instance, the two poly-silicon electrical structures 390, 400, are arranged below the metallization layers M0 and M1. As a consequence, these two structures may be connected to a signal line extending in either of the two metallization layers M0 and M1, by placing one or more contacts 310 as described in the context of FIG. 4. In the case of the conductive structure 380, which itself is part of the metallization layer M0, a signal line coupling to this structure may be routed in the metallization layer M1, by placing an appropriate contact.

The previous discussion showed the equivalence and similarity of the standard cells 130 of a design library and a standard cell as implemented in an integrated circuit. Placing a contact between a conductive structure 200 and a signal line 140 in terms of a process generating layout is often equivalent to the introduction of a via interconnecting to metallic, or otherwise, conductive structures, which are separated by an insulating layer in-between. If more than just one insulating layer is to be bridged by a contact 310, it may be suitable to place more than one contact, or to place more than one via with intermediate conductive structures, as it was for instance shown in FIGS. 2 and 5b.

Figure 6A:
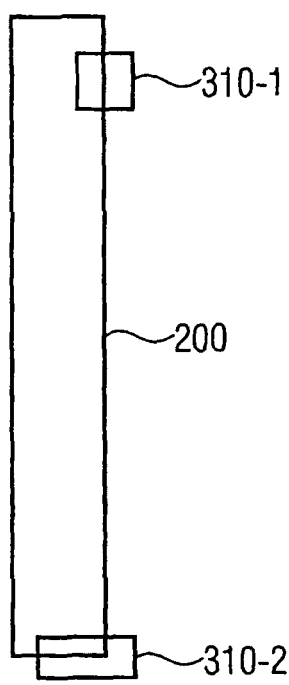
FIGS. 6a and 6b illustrate placing of contacts according to embodiments of the invention.
Figure 6B:
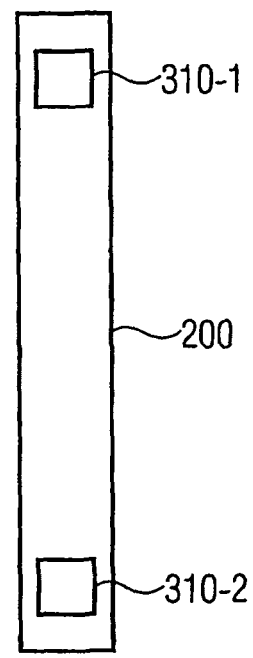

FIGS. 6a and 6b show several examples of how contacts 310, for instance, in the form of vias, may be placed according to an embodiment of the invention.

FIG. 6a shows a conductive structure 200 along with a first and a second contact 310-1, 310-2. The contacts 310 may differ with respect to their geometry, their position, and further parameters. The first contact 310-1 shown in FIG. 6a is a square-shaped contact, while the second contact 310-2 comprises a rectangular-shape. Moreover, the two contacts 310 differ with respect to their positions. While the first contact 310-1 is placed over one side of the conductive structure, the second contact 310-2 is placed over a corner of the conductive structure 200.

In contrast, FIG. 6b shows the same conductive structure 200, along with two placed contacts 310-1, 310-2. The two contacts 310 are identical in terms of their shape and in terms of their position with respect to the edges of the conductive structure 200. Both contacts 310 are square-shaped and located completely inside the circumference of the structure 200.

FIGS. 6a and 6b, however, illustrate that according to an embodiment of the invention, placing a contact 310 with respect to the conductive structure 200 is by far not limited to ideally placing the contacts as illustrated in FIG. 6b. Depending on the specifications of the contact 310 and the structure 200 in mind, the overlap area of the contact 310 and that of the conductive structure 200, may itself, be smaller than the area of the contact 310 itself. Naturally, the contact 310 may also have different geometries than the ones shown in the figures. An example may, for instance be, a round contact 310 with a circular or oval cross-section.

Figure 7A:
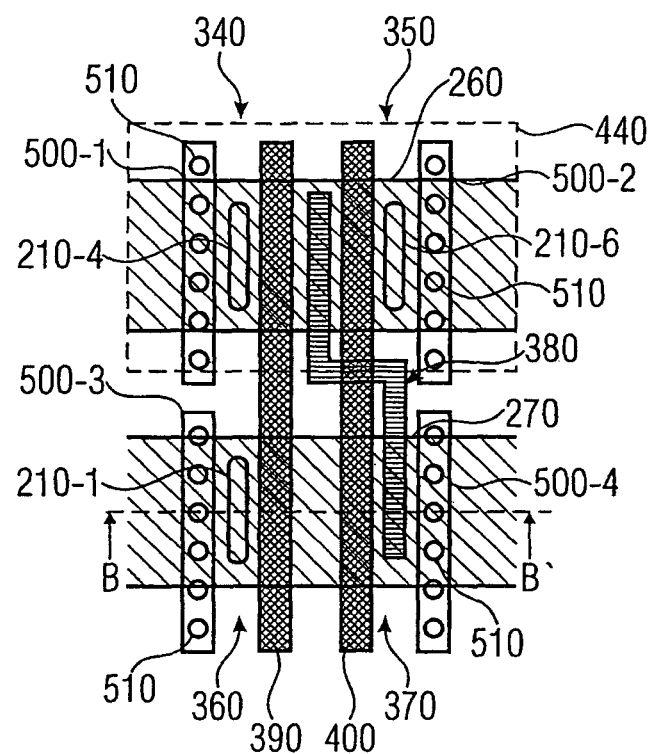
FIG. 7a shows a standard cell of an integrated circuit according to an embodiment of the invention in the form of a NAND gate.

FIG. 7a shows a top view of a further standard cell 130 according to an embodiment of the invention in the form of a NAND gate, which is similar to the one shown in FIG. 5a. Accordingly, FIG. 7b also shows a cross-section through a possible implementation of the standard cell of FIG. 7a according to an embodiment of the invention in the form of an integrated circuit 100. FIG. 7c illustrates a circuit diagram of the standard cell 130 of FIG. 7a.

While the circuit diagram of FIG. 7c is essentially identical to the circuit diagram of FIG. 5c, the standard cell 130 shown in FIG. 7a differs from its counterpart of FIG. 5a in terms of a few details which will be described in the following. Due to the similarities of the two standard cells shown in FIGS. 7a and 7a, reference is made to the description of the standard cell in FIG. 5a to allow for a more concise description. In addition, the cross-section shown in FIG. 7b, which however shows a non-continuous cross-section along the dashed line B-B' shown in FIG. 7a covering a wider range than the cross-section shown in FIG. 5b.

FIG. 7a is a more simplified representation of the standard cell in terms of the well structure and the contacts 310 (not shown) or, equivalently, wells 210 in the case of a standard cell of a design library, in terms of the vias 210 and the conductive structures 200 in the case of the standard cell of an integrated circuit. However, the standard cell 130 shown in FIG. 7a comprises additional structures that may favorably influence several steps of the manufacturing process of the integrated circuit according to an embodiment of the invention itself.

Before describing these additional structures, it should be noted that the representation of FIG. 7a is essentially more simplified than that of FIG. 5a, in terms of the contacts or vias 210 and the well structure. While FIG. 5a has explicitly shown different vias or contacts 210 along with intermediate conductive structures (e.g., conductive structure 200-1 shown in FIG. 5b), the representation of the standard cell 130 only shows the contacts or vias 210 between the second metallization layer M1 and the metallization layer M1, for instance, comprising the two power supply rail portions 260, 270. The metallization layer M0 underneath lying comprises, for instance, the conductive structure 380, which is also the output of the standard cell 130. In other words, instead of showing the conductive structure 200-1 along with the two vias 210-1, 210-2 of FIG. 5a, FIG. 7a shows only vias or contacts 210-a.

Accordingly, FIG. 7a also only shows vias or contacts 210-4 and 210-6, instead of the corresponding vias and conductive structures as shown in FIG. 5a, in the context of the transistors 340, 350. The contact or via between conductive structure 380 and the semiconducting surface 160, is also omitted for the sake of simplicity.

In terms of the well structure, FIG. 7a only shows the basic n-doped well or nwell 440, in which the two PMOS-transistors 340, 350 are formed. The additional p-doped diffusion areas forming the corresponding wells 450, 460, 470 (shown in FIG. 5a), for the source terminals and drain terminals of the two transistors 340, 350, have also been omitted for the sake of simplicity. Likewise, the n-doped diffusion regions 410, 420, 430 of the two NMOS-transistors 360, 370 are omitted for the sake of simplifying the representation of FIG. 7a. However, FIG. 7b also shows these wells along with the channel 480 of transistor 370 in more detail. Once again, the embodiment shown here is based on a p-doped substrate 170.

As an additional structures so far not shown in FIG. 5a, the standard cell 130 of FIG. 7a comprises four so-called diving bars 500-1, 500-2, 500-3, and 500-4 extending at least partially parallel to the two gate electrodes in the form of the two conductive structures 390, 400. The diving bars 500 are also part of the layer comprising the two conductive structures 390, 400 of the gate electrodes, which are often fabricated from poly-silicon. The diving bars 500 are hence also in many cases fabricated from poly-silicon.

However, compared to the conductive structures 390, 400 forming the gate electrodes of the four transistors 340, 350, 360, and 370, the four diving bars 500 are not required for the operation of the respective transistors. Although increasing the capacitance of the respective transistors due to their simple presence, the diving bars 500 lead, in many cases, to an improvement of the quality of the conductive structures 390, 400, in terms of the accuracy of the exposed or patterned structures during lithography and the generation of the corresponding structures during etching or milling. Therefore, although in principle being functionless structures, an incorporation of the diving bars 500 may be useful for the increasing of the overall quality of a fabricated standard cell 130 of an integrated circuit in some cases.

Since the diving bars 500 are usually considered to be functionless, only leading to an increased capacitance of the transistors, it may be suitable to contact the diving bars to a predefined or fixed potential. In the embodiment shown in FIG. 7a, the diving bars 500 are part of the poly-silicon layer also comprising the gate electrodes in the form of the conductive structure 390, 400. Therefore, the diving bars 500 may be electrically coupled to either the power supply rail portions 260, 270, similar to the source contact of the NMOS-transistors 360, or by establishing vias or contacts 510 to the surface of the substrate 170. The second alternative is implemented in the framework of the standard cells 130, as shown in FIG. 7a. A plurality of vias 510 electrically connect the diving bars to the substrate 170, thereby fixing its potential.

Figure 7B:
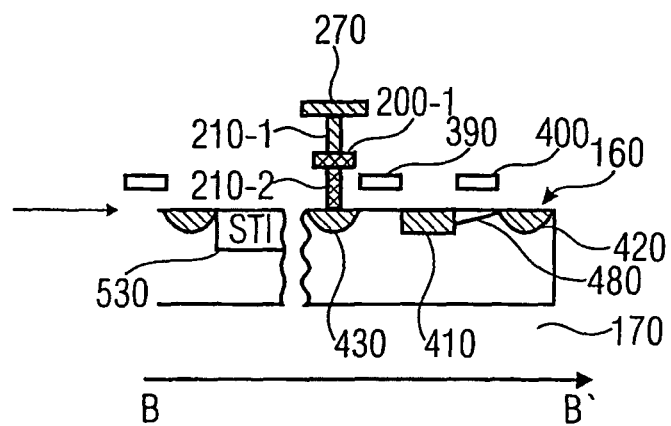
Figure 7C:
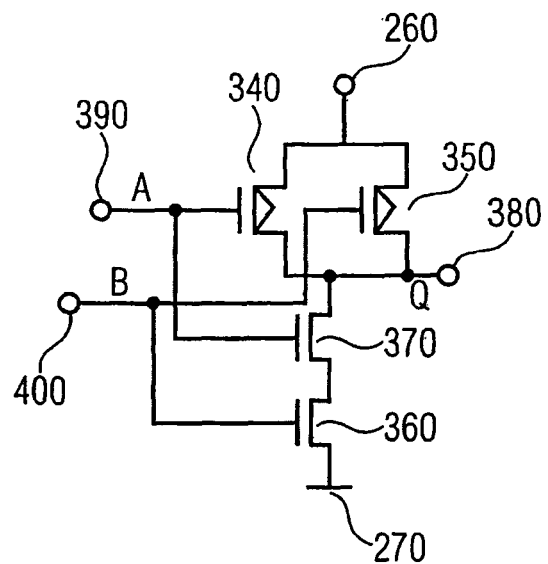

FIG. 7b furthermore shows a possibility of electrically insulating the individual transistors from one another and neighboring standard cells from one another. This can be achieved by implementing, between the NMOS transistor 430 and a next transistor 520, a shallow trench insulation 530 (STI), which may, for instance, comprise a trench filled with an insulating material, or which may be formed by diffusing a doping material.

In other words, a shallow trench insulation 530, as schematically depicted in FIG. 7b, may be implemented as a well-structure, for instance, in a p-doped substrate 170 in the form of an n-doped well (nwell). Naturally, other insulating structures, than the previously mentioned insulating trench may also be implemented. For instance, a standard cell 130 of a design library, as well as a standard cell 130 of an integrated circuit according to embodiments of the invention, may be implemented such that areas which do not comprise any structures are implemented as insulating well-structures as shallow trench insulations.

As already described in the context of FIGS. 5 and 6, the standard cell 130 as shown in FIG. 7a, does not comprise any ports, pads or predefined contacts to couple information carrying signals as the standard cell input signals to or as standard cell output signals from the NAND gate. However, the standard cell 130 according to an embodiment of the invention offers the possibility of freely placing contacts, for instance, in the form of vias 210, since no predefined via positions or contact positions are comprised in at least some electrical structures.

Therefore, the standard cell 130 as shown in FIG. 7a along with other standard cells according to the invention, offer the possibility of highly flexibly placing contacts taking into consideration the structure of the standard cell, possibly routed signal lines, as well as power supply rails and portions thereof.

As the embodiments shown in FIGS. 5a and 7a have illustrated, this flexibility is, for instance, achieved by not implementing a continuous rail or portions thereof at the outer borders of the standard cell 130 (e.g. the power supply rails or portions thereof). The power supply rail portions 260, 270 along with a first and a second borderline 280, 290 (not shown in FIG. 7a), enclose an enclosed area 300 (not shown in FIGS. 5a and 7a), which only partially comprises the functional structures of the respective standard cell 130. In the embodiments shown in FIGS. 7a and 7b, this is for instance, achieved by extending the conductive structures 390, 400 (poly-silicon gates of the four transistors 340-370) outside the power supply rail portions 260, 270, such that by placing a via to the conductive structures 390, 400 is possible, as indicated in the context of FIG. 6.

This may, for instance, be done by extending conductive structures by more than 1.5 times the minimal structure width. In this manner, enough space is provided to allow a flexible placing of the contacts.

Depending on the concrete implementation of the standard cell 130, it may be advisable to implement extensions outside the enclosed area, as previously defined, of more than the previously mentioned 1.5 times the minimal standard width. Depending also on the type of signal to be provided to the respective standard cell input or generated by the respective standard cell, and provided to a respective standard cell output, structures may also extend the enclosed area by more than twice, thrice, or four, five, or ten times of those minimal structure width.

In other words, areas in which contacts may be placed to electrically contact structures carrying standard cell input or standard cell output signals, may extend further to the outside of the standard cell 130, the conductive structures which are used for contacting structural elements of the standard cell itself, and which are thus, part of the standard cell.

The standard cells 130 may be adapted to carry out logical functions, such as bit manipulations in terms of AND gates, OR gates, NAND gates, NOR gates, inverters and logical functions derived from the previously mentioned. In other words, standard cells 130 may implement basic logical functions of functions derived from the logical functions. Possible standard cells 130 therefore comprise inverters, buffers, NAND gates, NOR gates, tri-state inverter, tri-state buffer, mixed gates (e.g. combined NAND, NOR gates), multiplexers, latches, D-flipflops, scan path-D-flipflops (SDFF) and adders, to name but a few. A scan path-D-flipflop is a combination of D-flipflop and a multiplexer which is adapted to bypass the D-flipflop to allow, for instance, a verification of the integrity of the circuitry. Naturally, further standard cells comprising other logical functions, or functions based on the logical functions, may be implemented.

In yet other words, standard cells may be implemented with different strengths, electrical conductivities, electrical impedance values, and other electrical parameters. This may, for instance, be achieved by scaling the respective structures with a value (typically an integer value) indicating a relation between the smallest standard cell and the respective standard cell. For instance, an inverter which is sometimes also used as a driver circuit, and which may be designed to have four times the strength of a corresponding smaller inverter. This may be achieved by, for instance, multiplying the channel width of the respective transistors by the respective factor (i.e., 4 in this case).

A design library for generating a layout of an integrated circuit, may therefore, often comprises a plurality of different standard cells for different logical functions, or functions based on logical functions for different qualities, or strengths, as previously illustrated.

The standard cells 130 as illustrated, for example, in FIGS. 5a and 7a, are based on only two metal layers M0 and M1 inside the standard cell. Naturally, as already previously outlined, the standard cell design may comprise further metallization layers or even just a single metallization layer. Including an optional last metallization layer ML, which is typically used for power supply, bond pads and other auxiliary structures, embodiments according to the invention may, for example, be implemented, based on a single metallization layer (M0), two metallization layers (M0, M1), three metallization layers (M0, M1, M2), and more metallization layers.

The less metallization layers used in the final product, the greater the economical benefit of employing embodiments according to the invention may become. Thus, embodiments according to the invention may be employed in the context of integrated circuits having four or less metallization layers, optionally including or excluding the last metallization layer ML.

The metallization layers may be fabricated on the basis of different materials, such as aluminum (Al), copper (Cu), tungsten (W), and other metals and alloys. The use of a specific metal or alloy in the framework of a metallization layer is determined by a plurality of aspects of which only two are mentioned. Apart from costs for the raw material, also taking into consideration the desired or necessary purity of the materials, also the electrical conductivity or resistance may be important. For instance, copper signal lines may be fabricated having a specific thin film resistance of $0.04\Omega$ per square, wherein a typical thin film resistance of a tungsten film of the same thickness may have a resistance of $2\Omega$ per square.

Figure 8:
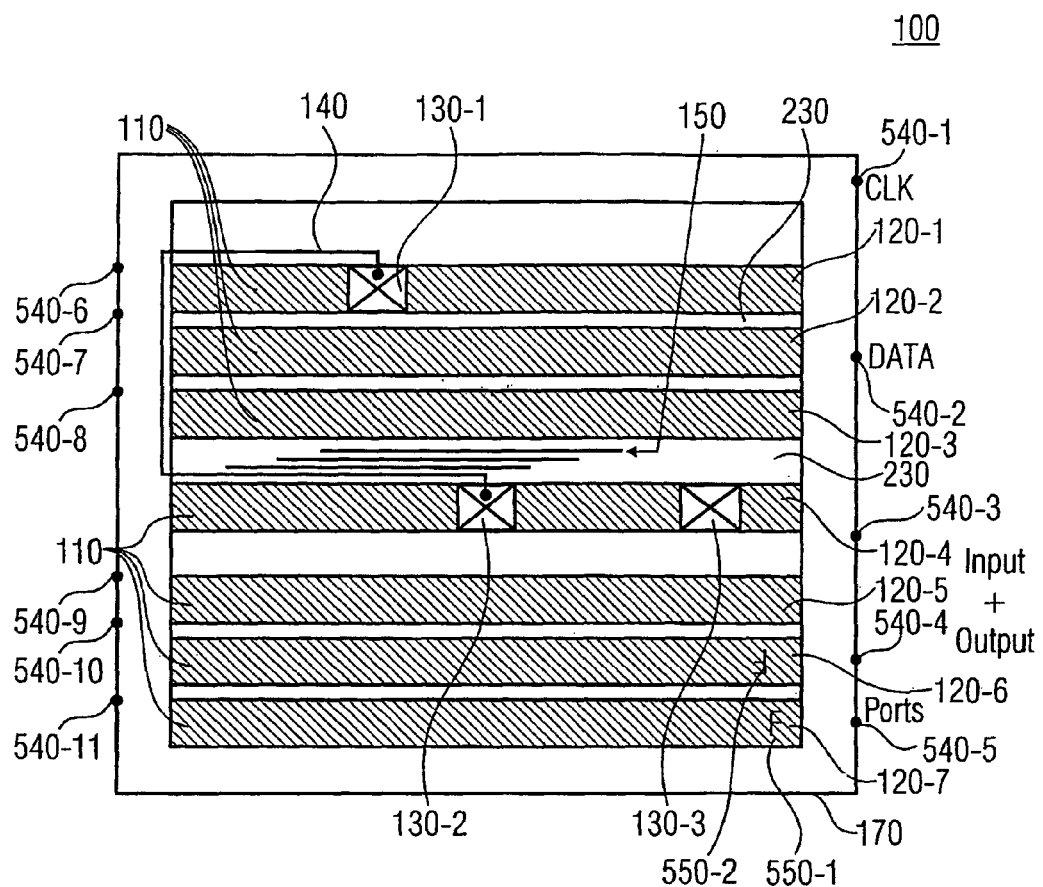
FIG. 8 illustrates an integrated circuit according to an embodiment of the invention.

FIG. 8 illustrates an integrated circuit 100 according to an embodiment of the invention based on the substrate 170, for example, an application specific integration circuit (ASIC). As shown in FIG. 8, the substrate 170 is often a rectangular-shaped substrate with a length of a latch between 1 mm and several 10 mm, or several inches. For typical ASICs, a length of a latch is in the range of approximately 3 mm to 13 mm. The same length is also typical of memory circuits, while processors often comprise a larger die area.

The substrate 170 comprises a die area, which is in the case of the embodiment shown in FIG. 8, equivalent to the surface of the substrate 170. A part of the die area is the core area 110, divided into seven rows 120-1, ..., 120-7 in FIG. 8. In each of the rows 120, the standard cells 130 can be placed and routed. To illustrate this, three standard cells 130-1, 130-2 and 130-3 are explicitly shown in FIG. 8. Naturally, the substrate or the die area may comprise more or less rows 120. Typically, the number of rows is, depending on the size of the substrate and the size of the core area 110, in the range between 10 and several 10 000. A signal line 140 for an information carrying signal couples the standard cells 130-1 and 130-2, as shown in the embodiment of FIG. 8.

The integrated circuit 100 can be fabricated based on only a small number of metallization layers, as previously indicated. To achieve this, the signal line 140 is arranged in gaps 230 between the rows 120 of the core area 110. Hence, the signal line 140 leaves the actual core area 110 and is routed inside the die area, which is not used as the core area 110. Apart from the signal line 140 interconnecting the two standard cells 130-1 and 130-2, the integrated circuit according to an embodiment of the invention comprises further metal lines 150, of which some are shown in a central gap 230 of the integrated circuit 100. The gaps 230 may vary in size, if at all present. Typically, gap 230 in the center of the die area are larger than those at the borders of the die area, since typically more signal lines are to be routed in the center area of the die area compared to the borders.

Apart from the core area 110, the signal lines 140, 150, the die area of the substrate 170 also comprises pads and ports at the outer edges of the die area, which are used to provide signals and data to the integrated circuit 100 and to transport processed signals away from the integrated circuit 100. To illustrate this, a plurality of ports 540-1, ..., 540-11, is shown in FIG. 8, of which some are marked as clock signal ports (CLK), data ports, and other input and output ports.

As already illustrated in the context of FIG. 1, the standard cells 130 may be mirrored or flipped with respect to two adjacent rows 120. In FIG. 8, this is again illustrated in the context of rows 120-6, 120-7 by the two "F"-like shapes 550. By mirroring the standard cells of the two rows 120-6, 120-7, as illustrated by the two shapes 550-1, 550-2, a simplification of the routing of the signal lines 140, 150, may be achievable, since signal lines 140, 150 may be routed directly between the two rows 120 involved.

Figure 9:
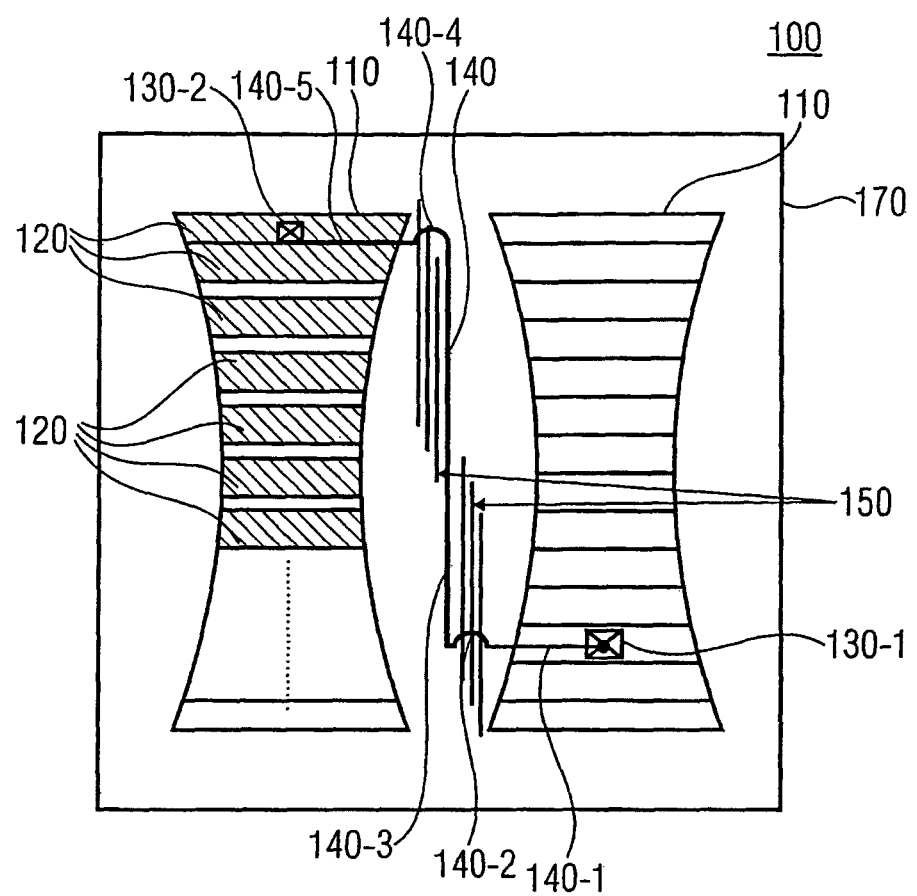
FIG. 9 illustrates an integrated circuit according to an embodiment of the invention.

FIG. 9 shows an integrated circuit 100 according to an embodiment of the invention with a substrate 170, which is equal to the die area. In contrast to the embodiment shown in FIG. 8 and the other previously shown embodiments, the core area 110 is not only separated into rows 120, but also into columns, of which each is cushion-like shaped. As discussed in the context of the embodiment of FIG. 8, the die area not occupied by the core area 110 in the center of the integrated circuit 110 is larger than the corresponding area at the borders of the substrate 170.

For illustrative purposes, two standard cells 130-1, 130-2 are shown in the core area 110. The two standard cells 130-1, 130-2 are coupled to one another by a signal line 140 for an information carrying signal. Naturally, further signal lines 150 are also placed and arranged on the substrate 170, a few of which are shown in FIG. 9. The signal line 140 comprises five segments, which will be described in more detail in the following.

The integrated circuit 100 shown in FIG. 9 is based on a technology with only a limited number of metallization layers. The integrated circuit 100 as shown in FIG. 9 can be implemented, apart from an optional last metal layer ML, with only two metallization layers M0 and M1.

Starting at the first standard cell 130-1, the signal line 140 comprises a first portion 140-1, which is arranged in the second metallization layer M1, and which is extending to the center area of the integrated circuit 100, which is not part of the core area 110. A third portion 140-3 of the signal line 140 is also routed in the second metallization layer M1 as are signal lines 150, which are also routed in the area. To connect the first and the third portion 140-1, 140-3 of the signal line 140, without causing an interference with the signal lines 150 also extending in the metallization layer M1, a second portion 140-2 is introduced, which is part of the first metallization layer M0. In other words, the signal lines 150 are crossed below their metallization layer M1 to connect the first and the third portion 140-1, 140-3 of the signal line 140.

The third portion 140-3 of the signal line 140 extending in the second metallization layer M1 is connected to a fifth portion 140-5 of the signal line 140 also extending in the second metallization layer M1 by a fourth portion 140-4 of the signal line 140 extending in the first metallization layer M0. The fourth portion 140-4 also serves to bypass or bridge further signal lines 150 also extending in parallel to the third portion 140-3 of the signal line 140 to prevent interconnections with any of these signal lines. The fifth portion 140-5 finally contacts a corresponding electrically conducting structure of the second standard cell 130-2.

Figure 10:
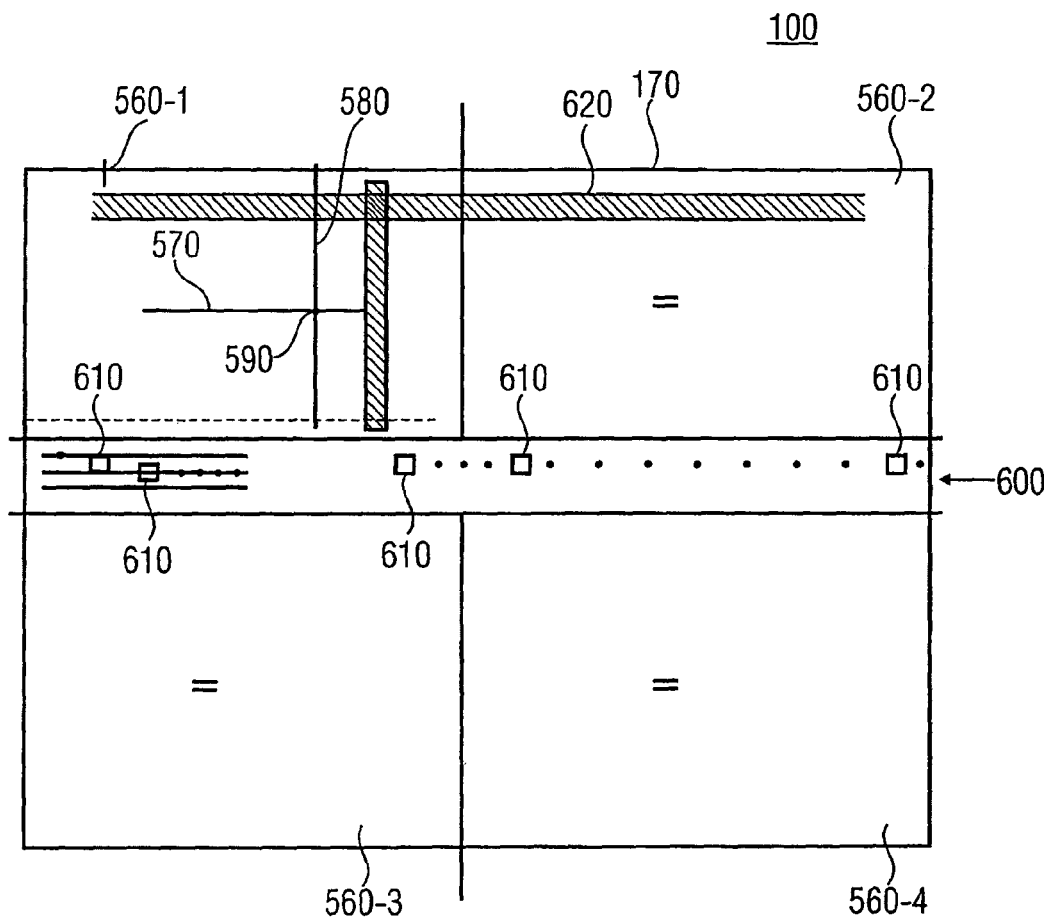
FIG. 10 illustrates a DRAM chip as an integrated circuit according to an embodiment of the invention.

FIG. 10 shows a further integrated circuit 100 according to an embodiment of the invention in the form of a commodity DRAM chip. The DRAM chip 100 may, for example, be a 1 Gigabit (1 Gb) chip comprising for instance four memory blocks 560-1, 560-2, 560-3, and 560-4 of 256 Megabit (256 Mb) each. Each of the memory blocks 560 comprises a highly optimized memory cell structure which is addressable by bitlines 570 and wordlines 580, each of which one is shown in the case of memory block 560-1. Naturally, each of the (optionally identical) memory blocks 560 comprises a plurality of bitlines 570 and wordlines 580. At each node of bitline and wordline, a memory cell 590 is arranged. Examples of memory cells 590 will be described in more detail in the context of FIGS. 11a and 11b.

The bitline 570 may be, for example, realized in the first metallization layer M0. In contrast, the wordline 580 may for instance be implemented in the metallization layer M1, or as a poly-silicon structure underneath the metallization layers. The bitlines 570 and the wordlines 580 may be, as previously discussed, implemented on the basis of aluminum, copper, tungsten, or any other metal or alloy. However, also an implementation in the form of poly-silicon or another semiconducting material is possible. In some cases, depending on the concrete implementation of a memory block 560, the first metallization layer M0 may be tungsten (W), and the second metallization layer (M1) may be aluminum (Al).

While the first and the second memory blocks 560-1, 560-2 are arranged directly adjacent to each other, as the third and the fourth memory blocks 560-3 and 560-4 are also arranged adjacently, an area 600 exists between the first two memory block 560-1, 560-2 and the third and the fourth memory blocks 560-3, 560-4. While the overall area of the substrate 170 is typically arranged between approximately 4 mm and approximately 11 mm (e.g., in the range between approximately 5 mm and approximately 10 mm), the height of the central area 600 is approximately 700 µm over the whole width of the substrate 170. It is this central area 600 in which standard cells 130 (not shown in FIG. 10) for logical units of the DRAM chip 100 are typically arranged. Examples are, for instance, an address decoder ECC/EDC-circuits (EDC=Error Detecting Codes; ECC=Error Correcting Codes) and other additional circuits for synchronization and exchange of data and signals. Moreover, the central area 600 often comprises a plurality of bond pads 610 of which a few are shown for illustrative purposes. The number of bond pads is often in the range of between 10 up to several 100. Typical values are in the order of approximately 100 bond pads 610.

The bond pads 610 are in many cases not part of the first or the second metallization layers M0, M1, but of the last metallization layer ML, which is used for the power signals and global signals. A T-shaped signal line 620 usually having a width, which is typically significantly (e.g., 2-times to 20-times) broader than that of the bitlines 570 and wordlines 580 is employed to distribute the corresponding global signals and power signals to all components of the DRAM chip 100. Naturally, the DRAM chip 100 may comprise further signal lines 620 for power signals or global signals. In this context, global signals are information carrying signals. The last metallization layer ML is very often fabricated on the basis of structure widths and the material which allows comparably small resistances, since the signal line 620 of the last metallization layer M1 may be required to carry power supply currents for the whole chip 100. Therefore, it may happen that the height of the central area 600 is limited due to the structures arranged in the center areas 600.

Naturally, the DRAM chip 100, according to an embodiment of the invention, may comprise more or less individual memory blocks 560, which may also be differently arranged on the substrate 170. More or less metallization layers than the three mentioned (M0, M1, ML), may also be employed. The substrate 170 may also be smaller or larger than the dimensions provided above.

Figure 11A:
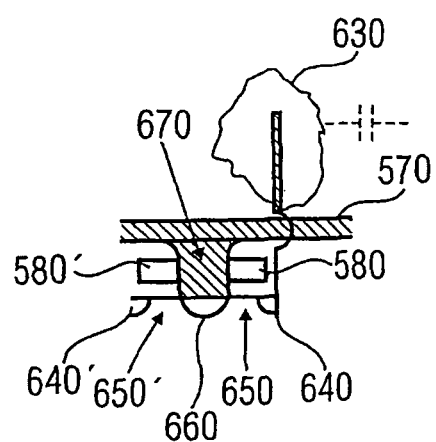
FIG. 11a illustrates a cross-section through a memory cell with a stack capacitor.

FIG. 11a shows a schematic cross-section of a memory cell 590 comprising a stack capacitor 630. The stack capacitor 630 is coupled to a source terminal 640 of a cell transistor 650 in the form of a field effect transistor. A drain terminal 660 of the cell transistor 650 is coupled to the bitline 570 by a via 670. A gate terminal of the cell transistor 650 is part of the wordline 580 or a conductive structure coupled to the wordline 580.

The via 670 connecting the bitline 570 with the drain terminal 660 of the cell transistor 650 may also be coupled to a neighboring memory cell with a cell transistor 650' so that the drain terminal 660 is also the drain terminal of the further cell transistor 650'. As a result, the via 670 is not only neighboring to the wordline 580, but also to a neighboring wordline 580', so that a typical diameter of the via 670 is a parameter to be implemented as small as possible. For instance, based on a 90 nm process, a diameter of the via 670 is approximately 90 nm.

Naturally, the memory cell 590 shown in FIG. 11a may differ with respect to a greater number of parameters. For instance, the diameter of the via 670, the concrete implementation of the stack capacitor 630, the other electrode of which the rest of the circuitry represents, and other parameters may differ in memory cells 590 on the basis of a stack capacitor 630.

Figure 11B:
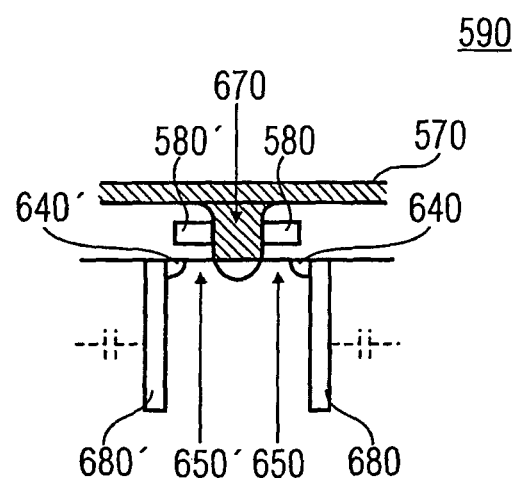
FIG. 11b illustrates a cross-section through a memory cell with a deep trench capacitor.

FIG. 11b shows a further possible implementation of a memory cell 590 on the basis of a cell transistor 650. In contrast to the memory cell 590 shown in FIG. 11a, the memory cell 590 shown in FIG. 11b is based on a trench capacitor 680, which is coupled to the source terminal 640 of the cell transistor 650. Apart from this difference, the memory cell 590 shown in FIG. 11b may be implemented identically to that of FIG. 11a.

Figure 12:
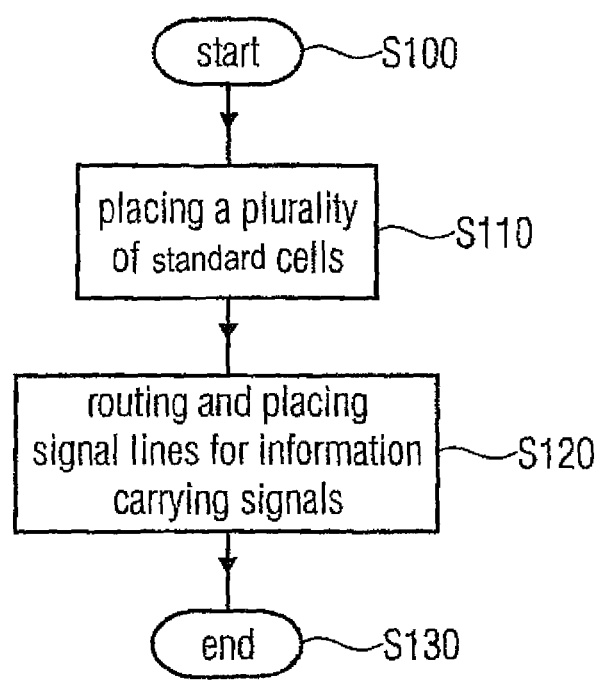
FIG. 12 illustrates a flow chart of a method for generating a layout of an integrated circuit according to an embodiment of the invention.

FIG. 12 shows a flowchart of a method for generating a layout of an integrated circuit based on a standard cell design according to an embodiment of the invention. As the previous description of integrated circuits 100 in their different forms and standard cells 130 according to embodiments of the invention have shown, at least some of the standard cells do not comprise predetermined contacts for at least one information carrying standard cell input signal, or for at least one information carrying standard cell output signal.

After a start in step S100, a plurality of standard cells 130 are placed in the core area 110 during step S110 as previously described. During step S120, signal lines for information carrying standard cell input or information carrying standard cell output signals are routed between the standard cells and non-standard cell circuits. During routing also one or more contacts for the standard cell input signal or the standard cell output signal are placed inside the respective standard cell, for which no predefined contacts are comprised in the placed standard cells.

In other words, during step S120, one or more contacts for non-internal standard cell signals and non-power supply signals are placed, as previously described in the context of FIGS. 3-7. A contact 310 may be placed at any location of a corresponding conductive structure 200, which is permissible, based on the location of other structural elements of the standard cell itself, and already routed signal lines. In this context, the hierarchical layers of structures of the standard cell, and optionally, of the routed signal lines may have to be taken into consideration. For instance, placing a contact 300 to a conductive structure 200 in the form of a via at a specific location might not be possible when at that specific location, a structure in a layer is present, which is arranged between the layer of the conductive structure and the layer of the signal layer. Hence, the hierarchy of the structure elements of the standard cell 130 and that of optionally routed signal lines may have to be taken into consideration.

Apart from such possible collisions in terms of location, during step S120 of routing and placing signal lines for information carrying signals, a great flexibility exists due to the inner structure of the standard cells 130 having at least one non-predefined location for a contact of a conductive structure carrying a standard cell input or a standard cell output signal.

Routing and placing of signal lines for information carrying signals may, for instance be achieved on the basis of routing information. Such routing information may for instance be provided in the form of lists defining nets or nodes and for each net or node functionally in terms of descriptors of the corresponding conductive structures 200 of the standard cell 130, which are to be connected to which net or node. For example, routing information may comprise a piece of information that the conductive structure 390 of FIG. 5a which represents an input of the NAND gate shown in FIG. 5a, to a node to which also an output of another standard cell or non-standard cell circuitry is connected. For instance, the conductive structure 380 of FIG. 5a, which is the output of the NAND gate, the same node may be coupled to the previously defined node connected to the conductive structure 390 of the previously mentioned standard cell. As a consequence, a series connection of the two previously mentioned standard cells 130 will result.

However, the routing information may also comprise additional information concerning, for instance, a diameter of geometrical layout of the contact 310 to be placed, as well as other routing-and-placing specific parameters and information.

Depending on the concrete implementation of an embodiment according to the invention, the routing and placing signal lines for information carrying signals in step S120, may further comprise routing different portions of signal lines 140 in at least two different conductive layers, as described in the context of FIGS. 1, 2, and 9. In this case, routing may also comprise placing an intermediate connection between the two routed signal lines in the at least two layers to provide electrical contact between the two layers.

A method for generating a layout according to an embodiment of the invention as shown in FIG. 12, may further comprise, before ending in step S130, connecting supply lines and supply rails, as well as routing information carrying and non-information carrying signal lines between standard cells and non-standard cells circuitry. Examples of such non-standard cell circuitry are bond pads or other circuitry, which is simply not based on the standard cell design.

A further approach according to embodiments of the invention is, as shown in the previous description of the standard cells 130, the contacts for wells and the substrate are not included in the standard cells. In other words, also at least some of the standard cells do not comprise predetermined contacts for wells or the substrate.

Since, the precise location of at least one contact for a well and the substrate are typically not required, as long as certain implementation-specific design rules are obeyed, the contacts for wells and the substrate may also be omitted in the standard cells themselves. These contacts may be incorporated when the routing of the signal lines as previously described is completed. During the design process, a post-processing may then be started, after a placing and routing, as, for example, described in the context of FIG. 12, in which the contacts for the substrate and the wells are placed at three non-predefined locations inside and outside the standard cells.

Depending on the implementation of a method according to an embodiment of the invention, possible locations for a contact may be automatically determinable on the basis of the knowledge of the respective conductive structure of the standard cell and the hierarchy of the structural elements of the standard cell 130. Additionally or alternatively, the locations may be determined by a definition of allowable areas inside the standard cells 130, which are "free" in terms of access to the respective structure. In other words, in the second case allowable areas of individual conductive structures or globally allowable areas may be defined as part of the standard cells 130.

Figure 13:
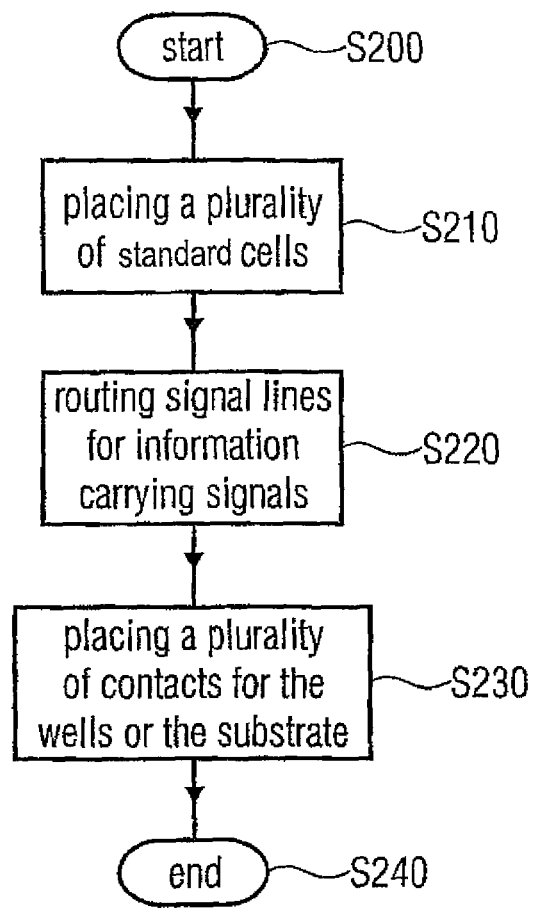
FIG. 13 shows a flow chart of a method for generating a layout of an integrated circuit according to an embodiment of the invention.

To further illustrate this, FIG. 13 shows a flow chart of a method of generating a layout of an integrated circuit 100 based on a standard cell design according to an embodiment of the invention, wherein at least some of the standard cells 130 do not comprise predetermined contacts for wells or a substrate. After a start in step S200, a plurality of standard cells is placed in a step S210. Afterwards, information carrying signal lines for at least one standard cell input signal or for at least one standard cell output signal is routed between the standard cells, or between a standard cell and a non-standard cell circuitry in step S220. In a step S230, a plurality of contacts for the wells of a substrate are placed inside the core area, taking into consideration, the locations of structural elements of the placed standard cells 130 and the routed signal lines, before the method ends in step S240.

In other words, as the previous description of the standard cells has already shown, the standard cells 130 do not comprise at least one contact for a well or a substrate. Hence, during the step of placing a plurality of contacts for the wells or the substrate in step S230, these contacts may be freely placed, taking into consideration the positions or locations of previously placed structural elements, of the standard cells and the placed signal lines. Moreover, according to embodiments of the invention, placing the plurality of contacts may also take into consideration design rule parameters, for instance, specifying a maximum or a minimum distance between substrate contacts, a maximum or minimum distance of well contacts, and other design-related parameters which may become important during an operation of the integrated circuit, the layout of which is generated.

The previously mentioned examples of design rule parameters may, for instance, lead to limiting potential fluctuations of the substrate or wells, which may negatively influence the operation of neighboring standard cells, or their electrical components (e.g., transistors).

The design rules or design rule parameters may also comprise fabrication-related parameters. An example may, for instance, be a ratio of an area of the substrate to be covered with the metal of a specific metallization layer (e.g., M0, M1, . . . ), as both, an upper limit and a lower limit. This may, for instance, be useful in improving the throughput of the CMP steps (CMP=Cine Chemical Mechanical Polishing), which are used to remove superfluous or unnecessary material deposited and to obtain a flat surface for further process steps.

Moreover, embodiments according to the invention in the form of the method for generating a layout, may further comprise routing signal lines between placed contacts for wells or the substrate and supply line or supply rail, when a direct electrical contact by placing a contact in the form of a via may not be enough. This may be necessary since, for instance, a vertical displacement may have to be bridged. In this case, embodiments according to the invention may further comprise routing signal lines between placed contacts of wells or the substrate and the corresponding supply lines.

In other words, embodiments according to the invention are also based on the finding that placing contacts for the substrate and wells, and optionally connecting these with a power supply to rail or power supply line (e.g., power or ground), may bring the effect that an efficiency of using the area of the substrate 170 may be improved. Additionally, or alternatively, the electrical performance may be improvable in the contacts for the substrates, and the wells can be more freely placed, since the contacts for the substrate and the wells can be place in the layout. As a consequence, by removing contacts from the substrate and the wells form the standard cells themselves, which may for instance, be located otherwise in the center or at a border of the respective standard cell, the previously described greater flexibility with its possible effects, may be achievable.

Methods according to the two FIGS. 12 and 13, according to embodiments of the invention may optionally be combined. In this case, step S210 may be equivalent to step S110, and S220 may be equivalent to step S120. However, other combinations of the two methods according to the embodiments of the invention, as well as a separate application of the methods, may also be implemented. Also one or more steps may be replaced by commonly known steps.

As the following description of an embodiment according to the invention, with respect to FIGS. 14 to 17 will also illustrate, the standard cells 130 themselves appear several times in the layout. Starting from the given layout of an integrated circuit, a standard cell 130 can, for instance, be identified on the basis of a statistical analysis of the structural elements appearing several times in this context. An integrated circuit according to an embodiment of the invention are recognizable, since at least one standard cell appears several times, but the well contacts, substrate contacts, and other standard cell input or output signal carrying structures are coupled to the corresponding signal lines at different places inside the standard cell. Examples are the previously described gate contacts in the case of FIGS. 5a and 7a.

Embodiments according to the invention are, therefore, recognizable, since the way of contacting a specific standard cell 130 and/or the corresponding substrate contact and well contacts may vary from standard cell to standard cell, wherein the standard cell itself does not vary. The standard cells are recognizable by a person skilled in the art, or alternatively, by a statistical analysis, taking into consideration rotating, flipping or mirroring the respective standard cells. An example of this will be outlined in the following, in the context with a standard cell 130 shown in FIG. 14, and excerpts from different stages of placing and routing both, signal lines and contacts for wells and substrates.

Figure 14:
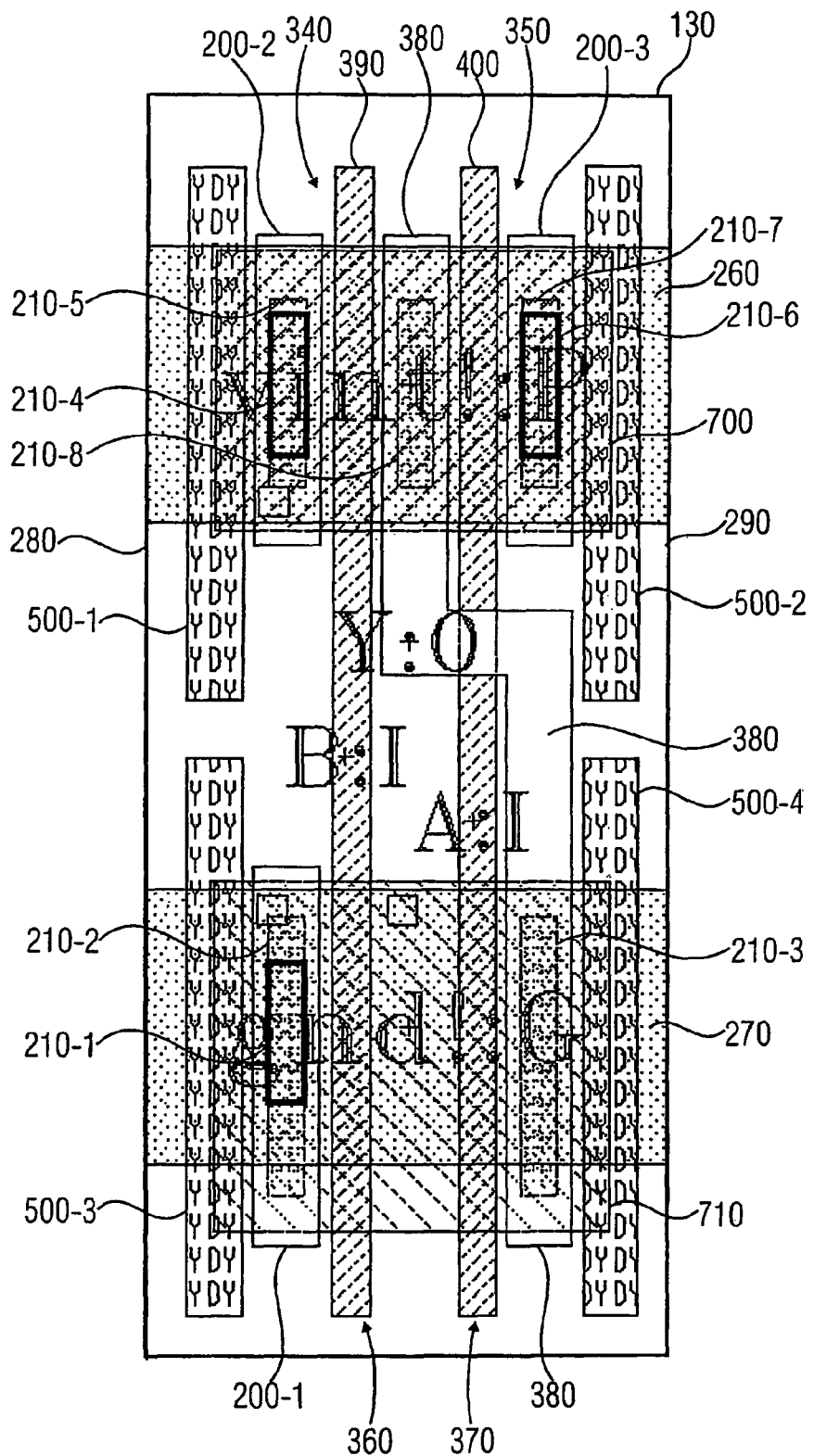
FIG. 14 illustrates a standard cell of a design library according to an embodiment of the invention.

FIG. 14 shows a new standard cell 130 according to an embodiment of the invention, again in the form of a NAND gate, as explained in the context of FIGS. 5a and 7a. Due to the similarity of the standard cell, as shown in FIG. 14 and that of FIGS. 5a and 7a, reference is made to the description of these figures.

The standard cell 130 essentially differs from the standard cells shown in FIGS. 5a and 7a only in terms of the definition of the wells. The standard cells 130 shown in FIG. 14 comprises an n-doped region 700, which forms the basis of the two PMOS-transistors 340, 350, located inside the well 700. Accordingly, the standard cell 130 also comprises a further p-doped well 710 which adjusts the basic doping of the substrate 170 (not shown in FIG. 14) to accommodate the two NMOS-transistors 360, 370. Both wells 700 and 710 extend horizontally approximately from the center of the two diving bars 500-3, 500-1 to the center of the opposite diving bars 500-2, 500-4.

Moreover, FIG. 14 specifies the information carrying signals of the corresponding electrically conducting structures 380 (Y:O) carrying the output signal Y, as well as the two input signals A, B, of the two conducting structures 390 (B:I) and 400 (A:I). The two power supply rail portions 260, 270 are furthermore defined in terms of their intended potential during operation. The first power supply rail portion 260 is intended for the positive power supply voltage (Vint), whereas the second power supply rail portion 270 is intended for the ground potential (Gnd).

Figure 15:
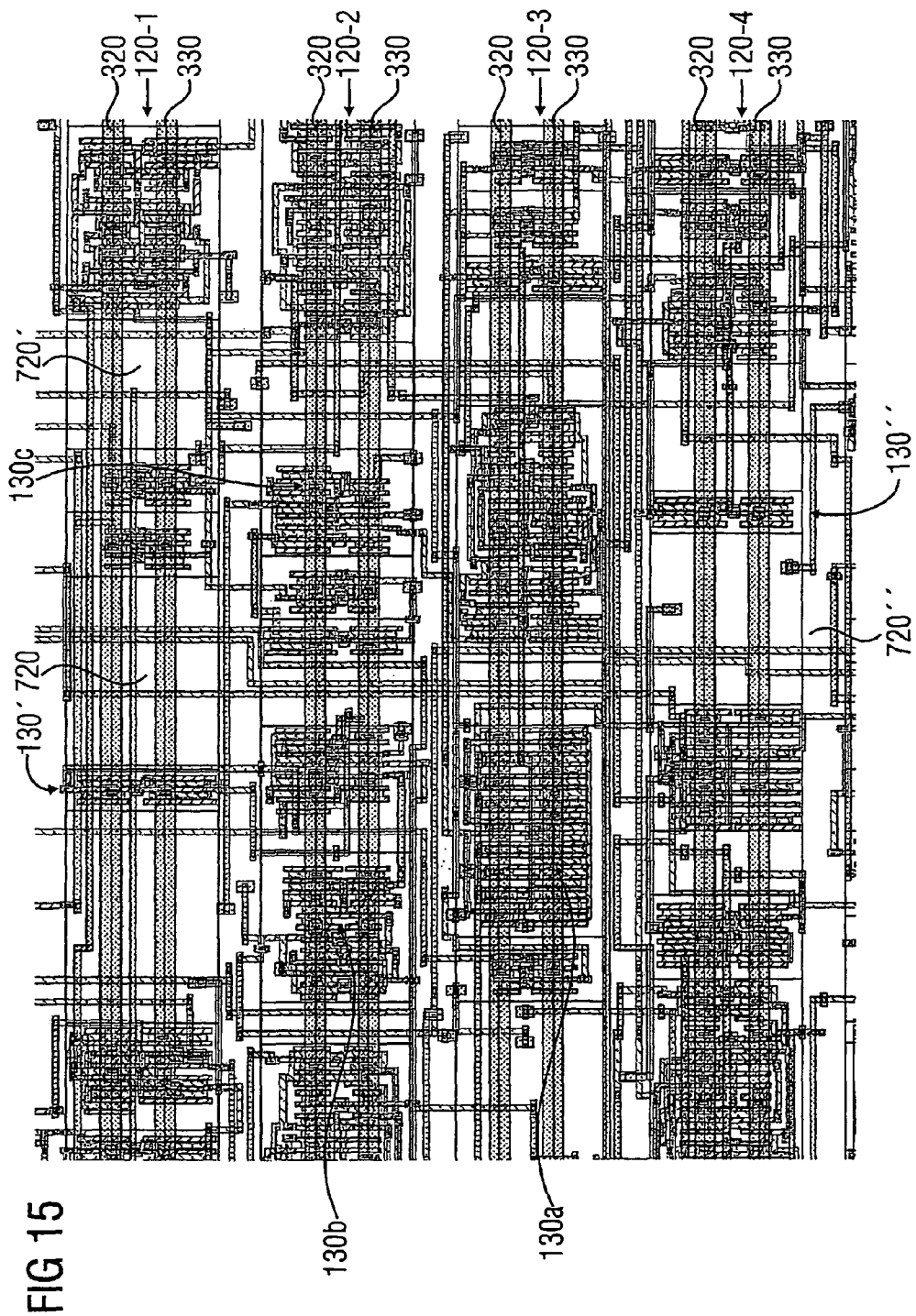
FIG. 15 shows an excerpt of a layout of an integrated circuit based on the standard cell of FIG. 14 and a method for generating a layout of an integrated circuit according to an embodiment of the invention.

FIG. 15 shows an excerpt of a circuit comprising the standard cell 130 as illustrated in FIG. 14, after placing a plurality of this and other standard cells and routing them as described in the context of FIG. 12. FIG. 15 shows a plurality of rows 120 in which standard cells are arranged. The first row 120-1, for example, comprises a standard cell 130' which also appears in row 120-4 in a flipped version as standard cell 130". The dotted broader lines in the center of the rows are the first and second power supply rail portions 260, 270 forming a first power supply rail 320, and a second power supply rail 330 for each of the rows.

Apart from the two standard cells 130' and 130", the layout shown in FIG. 15 also comprises a plurality of further, more complex standard cells 130a, 130b, and 130c, among others. However, the layout also comprises so-called filler cells 720, 720' of different sizes, which mainly comprise first and second power supply rail portions 260, 270 to prevent an interruption of the power supply rail 320, 330.

As can furthermore be seen from the layout shown in FIG. 15, only two metal layers (M0, M1) are used for contacting the standard cells. The horizontally extending metallic structures which are dotted in FIG. 15 are metallic structures of the second metallization layer M1. In contrast, the essentially vertically extending metallic structures which are hashed drawn in FIG. 15, are part of the first metallization layer M0, since metallization layer M0 is also used for a standard cell in the internal connection. As a result, the metallic structures of the first metallization layer M0 being signal lines for information carrying signals, essentially utilize the filler cells 720 to contact the standard cells of different rows 120.

Figure 16:
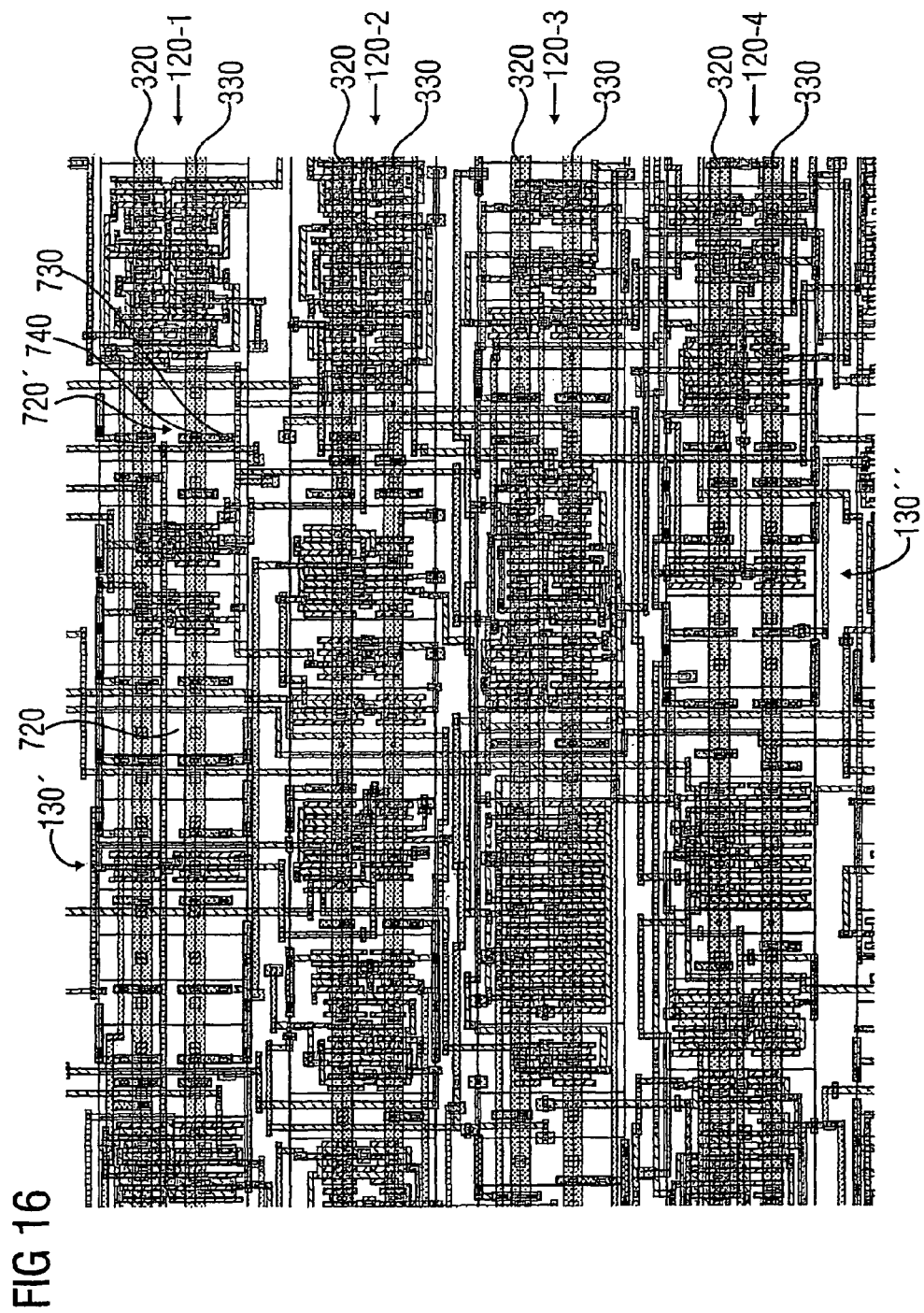
FIG. 16 illustrates the same excerpt as shown in FIG. 15 of a fully implemented layout block with substrate and well contacts according to an embodiment of the invention.

FIG. 16 shows the same excerpt of a fully implemented layer block with substrate contacts and well substrates, as shown in FIG. 15. By applying a method of generating a layout as shown in FIG. 13 according to the invention, the contacts for wells and the substrate have been placed. As a consequence, the layout of FIG. 16 offers an optimized efficiency concerning the area used and an optimized density concerning substrate contacts and well substrates.

Comparing the overviews of FIGS. 15 and 16 showing the same excerpt, a plurality of substrate and well contacts have been placed and contacted to different potentials. For instance, the filler cells 720, 720' comprise each a contact 730 for the substrate, which is coupled to the second power supply rail 330 for ground potential (as shown in FIG. 14), by a contact 740 in the form of a via. Similar substrate contacts and well contacts are placed at a variety of locations inside the layout as shown in FIG. 16. Some of these contacts are placed in the filler cells 720 which are used to allow the vertically extending signal lines implemented in the first metallization layer M0 to bridge a row 120 of the core area. However, corresponding substrate contacts or well contacts can also be placed inside standard cells 130, if sufficient space is available.

Figure 17:
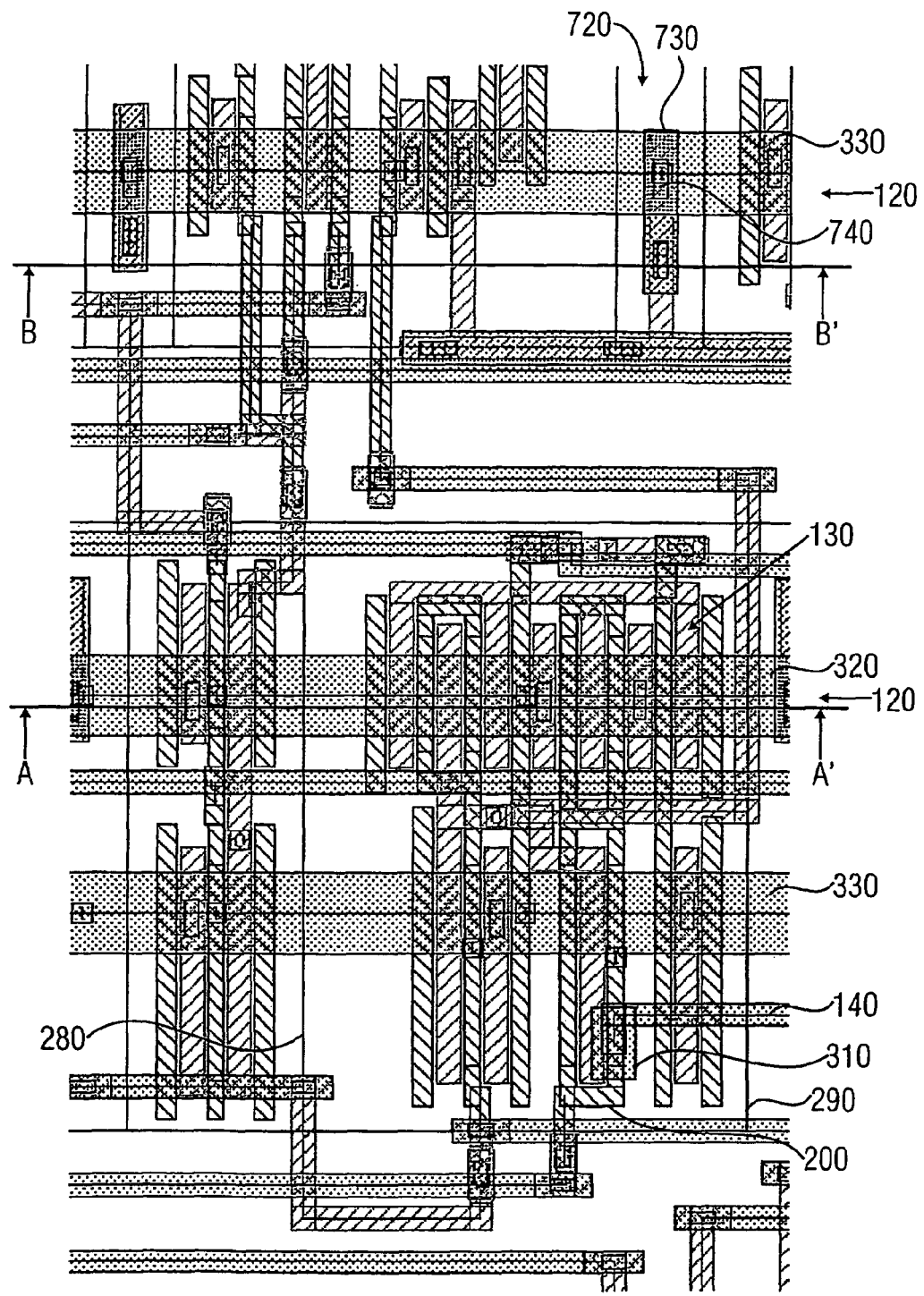
FIG. 17 shows a close-up of the excerpt shown in FIG. 16.

FIG. 17 shows a more detailed excerpt of the fully implemented layout as shown in FIG. 16. As a central element, FIG. 17 shows a complex standard cell 130, which is not an NAND gate as described in FIGS. 5a, 7a and 14. However, the standard cell 130 shown in FIG. 17 comprises a plurality of conductive structures 200 (downwardly hashed), which are poly-silicon structures. The conductive structure 200 comprises a placed contact 310 coupling a signal line 140 to the respective conductive structure 200. The signal line 140 leaves the standard cell 130, since the signal line 140 crosses the second borderline 290 of the respective standard cell 130. For the sake of completeness, the first borderline 280 is also denoted as such.

Moreover, FIG. 17 also shows a substrate contact 730 for the contact providing electrical contact to the second power supply rail 330 of the row 120 above. The corresponding cell in row 120 is a filler cell 120.

Figure 18A:
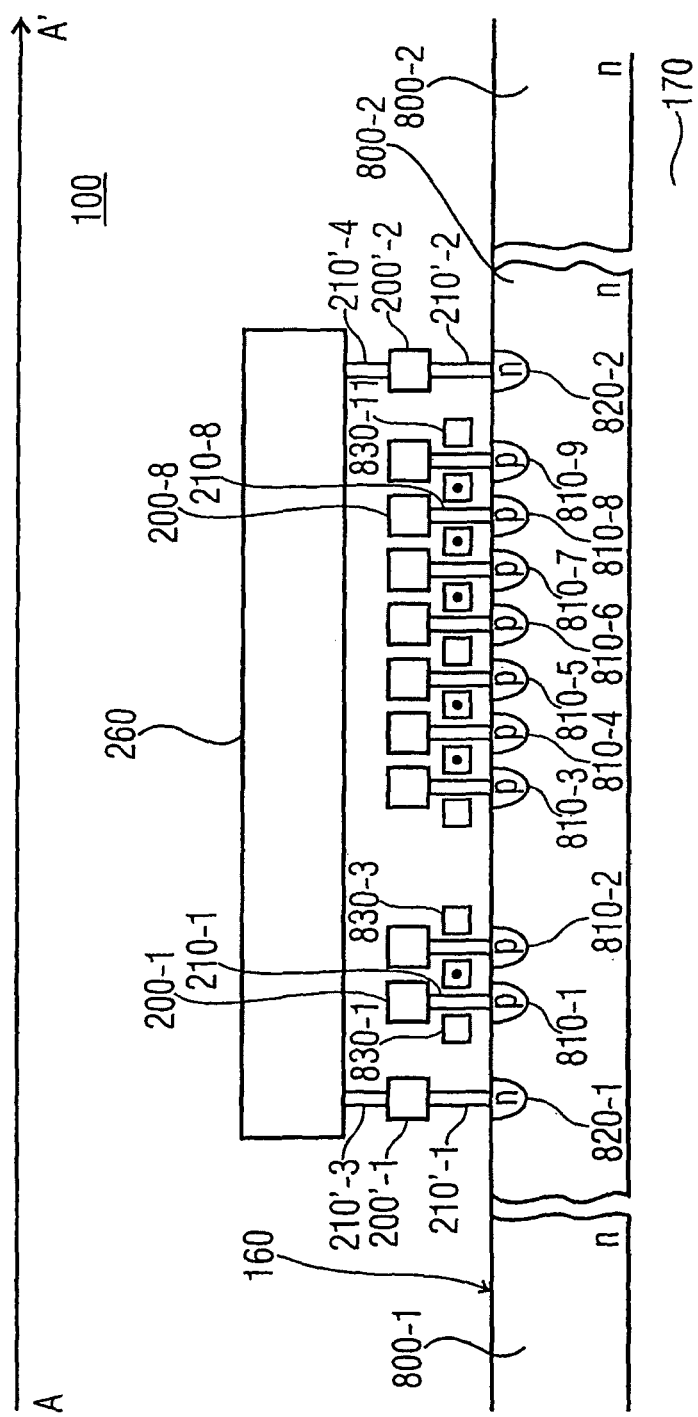
FIGS. 18a and 18b show cross-sectional views of an integrated circuit according to an embodiment of the present invention corresponding to the layout shown in FIG. 17 along lines A-A', and B-B', respectively.
Figure 18B:
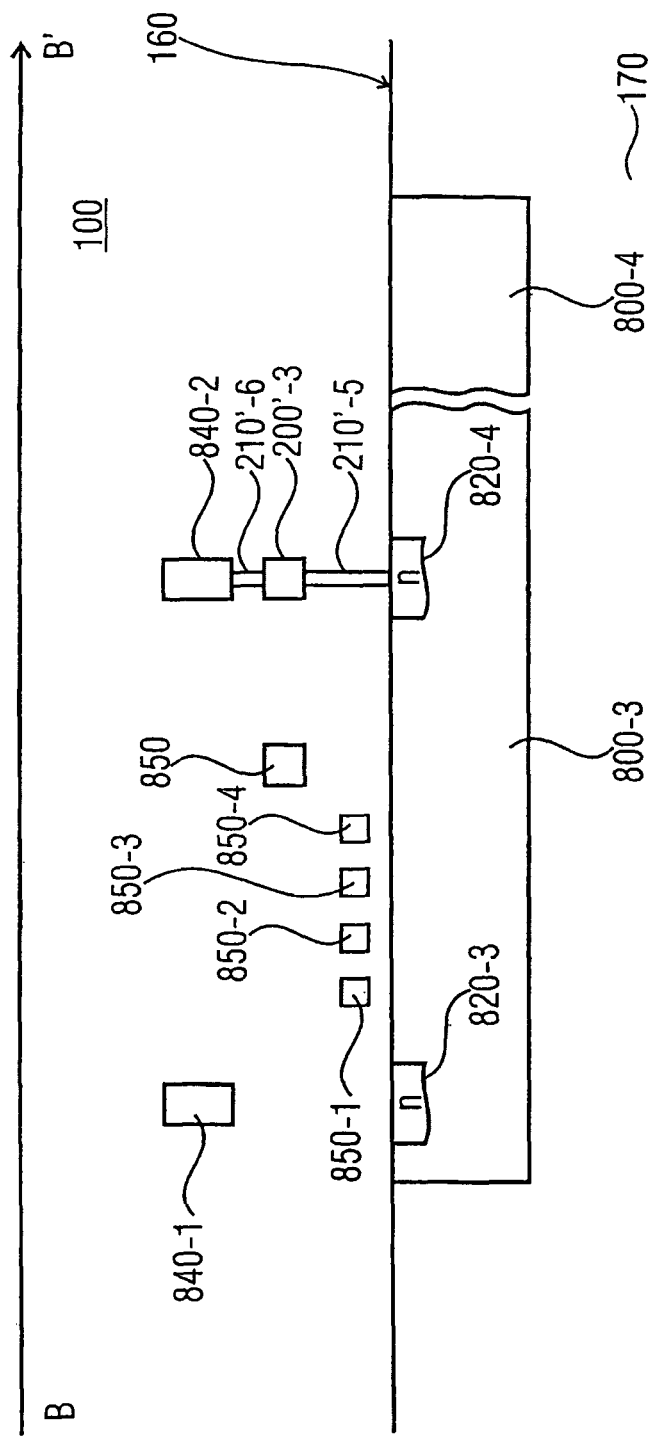

FIGS. 18a and 18b show cross sectional views of an integrated circuit according to an embodiment of the present invention based on the standard cell layout shown in FIG. 17 with respect to lines A-A' and B-B' of FIG. 17, respectively. The integrated circuit is based on a substrate 170 comprising three n-doped wells 800-1, 800-2 and 800-3 on the basis of which the body areas of the transistors implemented inside are formed. Inside well 800-2, just underneath a surface 160 of the substrate 170, a plurality of p-doped wells 810-1, ..., 810-9 are formed inside the n-doped well 800-2 which act as source and drain terminals of transistors implemented inside the n-doped well 800-2. The p-doped wells 810 are, hence, comparable to the wells 410, 420 and 430 shown, for instance, in FIG. 7b.

The n-doped well 800-2 further comprises in the cross sectional view shown in FIG. 18a two n-doped wells 820-1, 820-2, which are not part of a standard cell of the corresponding design library. The p-doped wells 810 are, on the contrary, part of the standard cell. In other words, the p-doped wells 820 are placed during a step 230 of placing a plurality of contacts for the wells and the substrate shown in FIG. 13 according to a method according to an embodiment of the present invention.

The p-doped wells 810 are electrically coupled to a plurality of conductive structures 200-1, ..., 200-9 by a corresponding number of vias 210-1, ..., 210-9. For the sake of simplicity, only the conductive structures 200-1 and 200-8 along with the corresponding vias 210-1 and 210-8 are labeled as such in FIG. 18*a*. The conductive structures 200-1, . . . , 200-9 along with their vias 210-1, . . . , 210-9 are part of a standard cell of the design library according to an embodiment of the present invention.

The n-doped wells 820-1 and 820-2 are coupled to corresponding conductive structures 200'-1 and 200'-2 by vias 210'-1 and 210'-2, respectively. Just as the n-doped wells 820, also the conductive structures 200' and the corresponding vias 210' are not part of a design cell of the design library. The vias 210 and 210' are also referred to be part of the contact hole layer C0 and the conductive structures 200' and 200 apart of the metallization layer or metal layer M0.

The cross sectional view of FIG. 18*a* furthermore shows a plurality of poly-silicon structures 830-1, . . . , 830-11, which are located underneath the conductive structures 200, 200' of the metallization layer M0. For the sake of simplicity, only the poly-silicon structures 830-1, 830-3 and 830-11 are labeled with their corresponding reference signs. The poly-silicon structures 830 may take over different functions. They may, for instance, operate as gate electrodes of the corresponding transistors as well as conductive structures to electrically coupled different parts and structures of the standard cell to name but a few. Consequently, the poly-silicon structures 830 shown in the cross sectional view of FIG. 18*a* are part of the standard cell of the design library.

The two conductive structures 200'-1, 200'-2 are coupled to a first power supply rail portion 260, which is located in the metallization layer M1, by vias 210'-3 and 210'-4, respectively. The two vias 210'-3 and 210'-4 are part of a layer of contact holes C1. Just as the conductive structures 200'-1, 200'-2 and the vias 210'-1 and 210'-2, also the vias 210'-3 and 210'-4 are not part of a standard cell of the design library, all these structures are placed during the previously mentioned step as 230 shown in the flow chart of FIG. 13.

It should be noted that the metallization layers M0 and M1 are used in the standard cells of the design library according to an embodiment of the present invention. The cross sectional view of FIG. 18*a*, hence, illustrates that embodiments according to the present invention are by far not limited to the case of a significant number of metallization layers above the poly-silicon layer, which itself is optional. FIG. 18*a* illustrates that embodiments according to the present invention may very well be implemented on the basis of only two metallization layers M0 and M1. Optionally, a further metallization layer (ML) may be used on top for bonding pads or the like.

FIG. 18*b* shows a further cross sectional view of an integrated circuit according to an embodiment of the present invention based on the design shown in FIG. 17 along the line B-B'. While the cross sectional view of FIG. 18*a* was taken along a plane intersecting at least a portion of the first power supply rail portion 260, the cross sectional view of FIG. 18*b* is taken along a parallel plane, as can be seen in FIG. 17. The substrate 170 comprises at its surface 160 an n-doped well 800-3 and an n-doped well 800-4. Inside the n-doped well 800-3, just underneath the surface 160, two n-doped wells 820-3, 820-4 are located. While in the cross section view of FIG. 18*b* the n-doped well 820-3 is not coupled to a conductive structure 840-1 of the metallization layer M0, the n-doped well 820-4 is coupled by a via 210'-5, a conductive structure 200'-3 and a further via 210'-6 to a conductive structure 840-2 of the metallization layer M1. The conductive structure 200'-3 is part of the metallization layer M0, while the via 210'-5 is part of the contact hole layer C0 and the via 210'-6 connecting the conductive structures 200'-3 and 840-2 is part of the contact hole layer C1.

Apart from these structures, the cross sectional view of FIG. 18*b* furthermore shows the conductive structure 850, which is also located in the metallization layer M1. Furthermore, the cross sectional view of FIG. 18*b* shows four gate electrodes 860-1, . . . , 860-4 which are located in the previously mentioned poly-silicon layer of the poly-silicon structures 830 shown in FIG. 18*a*. Actually, the gate electrodes 860 may be part of the poly-silicon structures 830 or coupled to them directly or indirectly.

Also the cross sectional view shown in FIG. 18*b* illustrates that the embodiments according to the present invention do not require three or more metallization layers. As shown in FIG. 18*b* along with the cross sectional view of FIG. 18*a*, embodiments according to the present invention may be implemented using only two metallization layers M0 and M1. Those metallization layers may be part of the standard cells of the design library on which the design is based. Naturally, embodiments according to the present invention may also be used in the case of more than two metallization layers as illustrated earlier.

In further embodiments according to the present invention, the doping of the substrate in terms of its wells may differ. In other words, the structure of the substrate underneath the surface may differ in other embodiments according to the present invention, for instance, by using complementary dopings, different doping concentration or a completely different doping structure with different wells. A complementary doping of an n-doped well is a p-doped well and vice versa.

Embodiments according to the invention may provide an integrated circuit with a substrate, including a plurality of standard cells, wherein the standard cells are adapted to fulfill an identical functionality. The corresponding functional structures of a first and a second standard cell of a plurality of standard cells are, at different locations inside the standard cells, electrically connected to information carrying signal lines interconnecting the first and the second standard cell with each other, with other standard cells, or with non-standard cells circuitry.

An embodiment according to the invention may further provide a standard cell of an integrated circuit, or of a design library, which comprises a first and a second power supply rail portion, wherein a projection of the first and the second power supply rail portion and a first and a second borderline of the standard cells enclose an enclosed area of the standard cell on a substrate of the integrated circuit. The conductive structure, which is adapted to carry an information carrying standard cell input signal, or an information carrying standard cell output signal, is at least partially arranged outside the enclosed area, such that an information carrying signal line leaving the standard cell is connected to the conductive structure, or such that an information carrying signal line leaving the standard cell is connectable outside the enclosed area.

An embodiment according to the invention may also provide a method for generating a layout of an integrated circuit based on a standard cell design, wherein at least some of the standard cells do not comprise predetermined contacts for a well or a substrate. A plurality of standard cells is placed in a core area and information carrying signal lines for at least one standard cell input signal, or for at least one standard cell output signal, is routed between the cells, or between a standard cell and a non-standard cell circuitry. A plurality of contacts is placed inside the core area for the well and the substrate, taking into account, the locations of structural elements of the placed standard cells and the routed signal lines.

An embodiment according to the invention also provides a method for generating a layout of an integrated circuit based on a standard cell design, where at least some the standard cells do not comprise predetermined contacts, for at least, one information carrying standard cell input signal, or for at least one information carrying standard cell output signal. A plurality of standard cells is placed in a core area and information carrying signal lines for standard cell input or standard cell output signals is routed, where the routing also includes placing a contact for the standard cell input signal, or the standard signal output signal, for which no predefined contacts are comprised in the placed standard cells.

As the preceding description of embodiments according to the invention has shown, embodiments according to the invention are applicable to semiconducting structures based on the standard cell design, which may in principle, implement an arbitrary number of metal layers. However, especially in the case of a lesser number of metal layers, for instance, four or less layers, the challenge of implementing an efficient process flow for generating a layout of an integrated circuit based on a standard cell design, may be accelerated or simplified by employing embodiments according to the invention. Moreover, implementing embodiments according to the invention may have the effect of reducing the area of the actual circuitry of the integrated circuit and improving the performance of the integrated circuit 100.

Depending on certain implementation requirements of embodiments of inventive methods, embodiments of the inventive methods can be implemented in hardware or in software. The implementation can be performed using a digital storage medium, in particular, a disc, a CD or a DVD having electronically readable control signals stored thereon, which cooperate with a programmable computer or processor such that an embodiment of the inventive methods is performed. Generally, an embodiment of the invention is, therefore, a computer program product where the program code stored on a machine-readable carrier, the program code being operative for performing an embodiment of the inventive method when the computer program product runs on the computer or processor. In other words, embodiments of the inventive methods are, therefore, a computer program having a program code for performing at least one of the embodiments of the inventive methods, when the computer program runs on the computer or processor. A processor can be formed by a computer, a chip card, a smartcard, an application-specific integrated circuit (ASIC) or an integrated circuit (IC).

While the foregoing has been particularly shown and described with reference to particular embodiments thereof, it will be understood by those skilled in the art that various other changes in the forms and details may be made without departing from the spirit and scope thereof. It is to be understood that various changes may be made in adapting to different embodiments without departing from the broader concept disclosed herein and comprehended by the claims that follows.

What is claimed is:

1. A standard cell of a design library, the standard cell comprising:
   a first and a second power supply rail portion, wherein the first and the second power supply rail portions and a first and a second borderline of the standard cell enclose an enclosed area of an overall area of the standard cell; and
   a conductive structure that carries an information carrying standard cell input signal or an information carrying standard cell output signal of the standard cell, the conductive structure being at least partially arranged outside the enclosed area such that the conductive structure is connected across at least one of the first and second rail portions to outside the enclosed area to an information carrying signal interconnection line.

2. The standard cell according to claim 1, wherein the standard cell fulfills a logical function.

3. The standard cell according to claim 1, wherein the conductive structure is connected outside the enclosed area by a metallic information carrying signal interconnection line.

4. The standard cell according to claim 1, wherein the conductive structure is a poly-silicon structure extending into the direction of the first and the second borderline outside the enclosed area by more than 1.3 times the minimal width of a metallic information carrying signal interconnection line.

5. The standard cell according to claim 1, comprising at least two transistors, which are at least partly arranged inside the enclosed area.

6. The standard cell according to claim 5, wherein the transistors are arranged with a distance from one another of less than 3 times a minimal distance for the corresponding transistor structures of an underlying technology in which the standard cells are to be fabricated.

7. The standard cell according to claim 1, wherein the standard cell lacks a predefined contact for at least one conductive structure adapted to carry an information signal such that a position, at which the said conductive structure is connected to an external signal interconnection line is selected after a placement of the standard cell.

8. A standard cell of an integrated circuit, the standard cell comprising:
   a first and a second power supply rail portion, wherein projections of the first and the second power supply rail portion and a first and a second borderline of the standard cell enclose an enclosed area on a substrate of the integrated circuit,
   a conductive structure that carries an information carrying standard cell input signal or an information carrying standard cell output signal,
   wherein the conductive structure is at least partially arranged outside the enclosed area across at least one of the first and second rail portions and connected outside the enclosed area to an information carrying signal interconnection line.

9. The standard cell according to claim 8, wherein the standard cell fulfills a logical function.

10. The standard cell according to claim 8, comprising at least two transistors, which are partly arranged inside the enclosed area.

11. The standard cell according to claim 10, wherein the transistors are arranged with a distance from one another of less than 3 times a minimal distance for the corresponding transistor structure of an underlying technology of the integrated circuit.

* * * * *